(12) United States Patent
Shinagawa et al.

(10) Patent No.: US 8,205,130 B2
(45) Date of Patent: Jun. 19, 2012

(54) DECODING APPARATUS

(75) Inventors: Masashi Shinagawa, Tokyo (JP);
Hiroyuki Yamagishi, Tokyo (JP);
Makoto Nada, Tokyo (JP)

(73) Assignee: Sony Corporation, Tokyo (JP)

( * ) Notice: Subject to any disclaimer, the term of this patent is extended or adjusted under 35 U.S.C. 154(b) by 1105 days.

(21) Appl. No.: 12/100,730

(22) Filed: Apr. 10, 2008

(65) Prior Publication Data

US 2008/0270868 A1    Oct. 30, 2008

(30) Foreign Application Priority Data

Apr. 27, 2007   (JP) ................................ 2007-119090

(51) Int. Cl.
*G06F 11/00*    (2006.01)
(52) U.S. Cl. ........................................ 714/752
(58) Field of Classification Search .................. 714/758, 714/752
See application file for complete search history.

(56) References Cited

U.S. PATENT DOCUMENTS

| | | | | |
|---|---|---|---|---|
| 2003/0079172 A1* | 4/2003 | Yamagishi et al. | ........... | 714/781 |
| 2004/0205446 A1* | 10/2004 | Yamagishi | .................... | 714/792 |
| 2005/0204272 A1* | 9/2005 | Yamagishi | .................... | 714/801 |
| 2008/0184084 A1* | 7/2008 | Matsumoto | .................... | 714/728 |
| 2009/0132887 A1* | 5/2009 | Matsumoto et al. | ........... | 714/752 |
| 2009/0265600 A1* | 10/2009 | Matsumoto et al. | ........... | 714/752 |

FOREIGN PATENT DOCUMENTS

| | | |
|---|---|---|
| JP | 2004-343170 | 12/2004 |
| JP | 2004-364233 | 12/2004 |
| JP | 2006-304129 | 11/2006 |
| JP | 2007-020068 | 1/2007 |
| JP | 2008-072247 | 3/2008 |

OTHER PUBLICATIONS

Hocevar, D.E., "A Reduced Complexity Decoder Architecture Via Layered Decoding of LDPC Codes," pp. 107-112 (2004).
Radosavljevic, P. et al., "Multi-Rate High-Throughput LDPC Decoder: Tradeoff Analysis Between Decoding Throughput and Area," Proc. Symposium on Personal, Indoor and Mobile Radio Communication 2006, pp. 1-5 (2006).
Prabhakar, A. et al., "A Scalable Decoder Architecture for Linear Congruential LDPC Codes," vol. 3, pp. 1911-1915 (2005).
Zhang, T. et al., "Joint Code and Decoder Design for Implementation-Oriented (3, k)-Regular LDPC Codes," vol. 2, pp. 1232-1236 (2001).
Wang, Z. et al., "A Memory Efficient Partially Parallel Decoder Architecture for Quasi-Cyclic LDPC CPDES," Ieee Transactions on Very Large Scale Integration (VLSI) Systems, vol. 15, No. 4, pp. 483-488 (2007).

(Continued)

*Primary Examiner* — Scott Baderman
*Assistant Examiner* — Yair Leibovich
(74) *Attorney, Agent, or Firm* — K&L Gates LLP

(57) ABSTRACT

In the present application, there is provided a decoding apparatus for decoding low density parity check codes, including: a plurality of storage sections configured to store logarithmic likelihood ratios or logarithmic posteriori probability ratios for one codeword into addresses thereof which are independent of each other thereamong; and a readout section configured to simultaneously read out, from among the logarithmic likelihood ratios or logarithmic posteriori probability ratios for the one codeword stored in the storage sections, a plurality of ones of the logarithmic likelihood ratios or logarithmic posteriori probability ratios which correspond to non-zero value elements in a predetermined one row of the check matrix used in a coding process of the low density parity check codes.

6 Claims, 9 Drawing Sheets

OTHER PUBLICATIONS

Zarubica, R. et al., "A Solution for Memory Collision in Semi-Parallel FPGA-Based LDPC Decoder Design," Signals, Systems and Computers, pp. 982-986 (2007).

Written Opinion dated Aug. 27, 2008.

R.G. Gallager, "Low density parity check codes," IRE Transanctions on Information Theory, vol. 8, pp. 21-28, 1992.

D.E. Hocevar, "A reduced complexity decoder architecture via layered decoding of LDPC codes," IEEE Workshop on Signal Processing Systems, pp. 107-112, 2004.

C. Howland et al., "Parallel decoding architectures for low density parity check codes," IEEE International Symposium on Circuits and Systems, vol. 4, pp. 742-745, 2001.

D.J.C. MacKay, "Good error-correcting codes based on very sparse matrices," IEEE Transactions on Information Theory, vol. 45, pp. 399-431, 1999.

Office Action dated Feb. 3, 2011 for corresponding Japanese Appl. No. 2007-119090.

* cited by examiner

VARIABLE NODE

CHECK NODE

|  | RAM a |  | RAM b |  | RAM c |  | RAM d |
|---|---|---|---|---|---|---|---|
| [1] | $q_1$ | [1] | $q_2$ | [1] | $q_3$ | [1] | $q_4$ |
| [2] | $q_5$ | [2] | $q_6$ | [2] | $q_7$ | [2] | $q_8$ |
| [3] | $q_9$ | [3] | $q_{10}$ | [3] | $q_{11}$ | [3] | $q_{12}$ |
| [4] | $q_{13}$ | [4] | $q_{14}$ | [4] | $q_{15}$ | [4] | $q_{16}$ |
| [5] | $q_{17}$ | [5] | $q_{18}$ | [5] | $q_{19}$ | [5] | $q_{20}$ |
| [6] | $q_{21}$ | [6] | $q_{22}$ | [6] | $q_{23}$ | [6] | $q_{24}$ |

|  | RAM a |  | RAM b |  | RAM c |  | RAM d |
|---|---|---|---|---|---|---|---|
| [1] | $q_1$ | [1] | $q_4$ | [1] | $q_7$ | [1] | $q_8$ |
| [2] | $q_2$ | [2] | $q_6$ | [2] | $q_{11}$ | [2] | $q_{10}$ |
| [3] | $q_3$ | [3] | $q_9$ | [3] | $q_{12}$ | [3] | $q_{14}$ |
| [4] | $q_5$ | [4] | $q_{18}$ | [4] | $q_{13}$ | [4] | $q_{15}$ |
| [5] | $q_{16}$ | [5] | $q_{20}$ | [5] | $q_{17}$ | [5] | $q_{22}$ |
| [6] | $q_{19}$ | [6] | $q_{21}$ | [6] | $q_{23}$ | [6] | $q_{24}$ |

DECODING APPARATUS

CROSS REFERENCES TO RELATED APPLICATIONS

The present application claims priority to Japanese Patent Application JP 2007-119090 filed in the Japan Patent Office on Apr. 27, 2007, the entire contents of which is being incorporated herein by reference.

BACKGROUND

The present application relates to a decoding apparatus for executing a decoding process for an LDPC code.

In recent years, research has been and is being carried out remarkably, for example, in the field of communication including mobile communication and deep space communication and the field of broadcasting including ground wave broadcasting or satellite digital broadcasting. Together with the research, also research relating to a coding theory, is being carried out energetically in order to raise the efficiency in error correction coding and decoding.

As a theoretical limit to the code performance, the Shannon limit provided by the channel coding theory of Shannon (C. E. Shannon) is known. Research relating to the code theory is carried out in order to develop a code which exhibits a performance proximate to the Shannon limit. In recent years, as a coding method which exhibits a performance proximate to the Shannon limit, a technique called turbo codes such as, for example, parallel concatenated convolutional codes (PCCC) or serially concatenated convolutional codes (SCCC) has been developed. While such turbo codes are developed, attention is paid to low density parity check codes (hereinafter referred to as LDPC codes) which are a coding method known for long.

The LDPC codes were proposed first by R. G. Gallager, "Low density parity check codes," Cambridge, Mass.: M. I. T. Press, 1963. After that, attention was paid again by D. J. C. MacKay, "Good error correction codes based on very sparse matrices," IEEE Trans. Inf. Theory, IT-45, pp. 399-431, 1999, M. G. Luby, M. Mitzenmacher, M. A. Shokrollahi and D. A. Spielman, "Analysis of low density codes and improved designs using irregular graphs," in Proceedings of ACM Symposium on Theory of Computing, pp. 249-258, 1998, and so forth.

It is being discovered by research in recent years that, as the code length of the LDPC codes increases, a performance closer to the Shannon limit is obtained similarly with the turbo codes and so forth. Further, since the LDPC codes have a nature that the minimum distance increases in proportion to the code length, they have a characteristic that they exhibit a good probability property and is advantageous also in that an error floor phenomenon which is observed from a decoding characteristic of the turbo codes and so forth little occurs with the LDPC codes, as disclosed in R. G. Gallager, "Low density parity check codes," IRE Trans. Inform. Theory, vol. 8, pp. 21-28, January, 1962 (hereinafter referred to as Non-Patent Document 1).

The LDPC codes are linear codes defined by a sparse parity check matrix H which includes a very small number of non-zero value elements, and those codes wherein the number of non-zero value elements is fixed among rows and columns of the check matrix H are called regular LDPC codes while those codes other than the codes described are called irregular LDPC codes.

Coding of LDPC codes is carried out in the following manner. In particular, Gaussian elimination and replacement of appropriate columns are applied to the check matrix H to generate a generation matrix G, and a vector c of a codeword of n bits is generated based on a vector s of k information bits and the generation matrix G. Further details of the coding are disclosed in D. J. C. MacKay, "Good error-correcting codes based on very sparse matrices," IEEE Trans. Inform. Theory, vol. 45, pp. 399-431, October 1999 (hereinafter referred to as Non-Patent Document 2).

As a representative decoding method for LDPC codes, a sum-product decoding method is available. The sum-product decoding method is basically equivalent to an algorithm known as Belief Propagation (BP).

Further, the LDPC codes are decoded by an iterative decoding algorithm based on a message passing algorithm which operates on a Tanner graph which defines the LDPC codes.

On the Tanner graph, each variable node corresponds to a column of the check matrix H, and each check node corresponds to a row of the check matrix H. Further, while the target of the algorithm is to determine a posteriori probability corresponding to each transmission symbol from received values, since generally a Tanner graph of the LDPC codes includes a loop, an accurate posteriori probability cannot be calculated by the BP, but approximate calculation is used. However, it is known that, where the graphs are sparse, the approximation technique provides a comparatively good result.

Also an algorithm (Layered BP algorithm) has been proposed wherein, by updating, for every row of the check matrix, a message P from a variable node to a check node which is used for updating of a message a from the check node to the variable node in the sum-product decoding method, even if the number of times of iteration is small, a performance similar to that of an ordinary sum-product decoding method can be implemented and also the memory amount can be reduced. The Layered BP algorithm is disclosed, for example, in D. E. Hocevar, "A reduced complexity decoder architecture via layered decoding of LDPC codes," IEEE Workshop on Signal Processing Systems, pp. 107-112, 2004 hereinafter referred to as Non-Patent Document 3).

In such LDPC decoding, it is necessary to select, from within a logarithmic likelihood vector $?=[\lambda_1 \lambda_2 \ldots \lambda_n \ldots \lambda_N]$ or a logarithmic posteriori probability ratio vector $Q=[q_1 q_2 \ldots q_n \ldots q_N]$ for one codeword, where the element in the mth row of the nth column of the check matrix H of M roses and N columns is represented by $h_{mn}$, those elements which satisfy $h_{mn}=1$ for each row of the check matrix H. For example, if it is assumed that $h_{mn}=1$ is satisfied by $N_H$ sets and the time interval is represented by $T_S$, time of $2 \times N_H \times T_S$ is necessary in order to carry out updating of a message from a variable node to a check node and to carry out updating of a message from a check node to variable node regarding each set. Further, if the updating of a message from a variable node to a check node and the updating of a message from a check node to a variable node are carried out repetitively by $N_I$ times, then the time required to decode a reception codeword is $2 \times N_H \times N_I \times T_S$. Usually, the latency permitted for decoding is in most cases lower than $2 \times N_H \times N_I \times T_S$, and it is somewhat difficult to incorporate this configuration.

Therefore, a sum-product decoding method wherein calculation for message updating is carried out simultaneously at all nodes has been proposed and is disclosed, for example, in C. Howvland and A. Blanksby, "Parallel Decoding Architectures for Low Density Parity Check Codes," IEEE International Symposium on Circuits and Systems, vol. 4, pp. 742-745, May. 2001 (hereinafter referred to as Non-Patent Document 4). In the configuration of the sum-product decoding method, since calculation for $N_H$ sets is carried out in one clock, the time required for decoding is $2 \times N_j \times T_S$, and therefore, the latency can be reduced significantly.

Also a configuration has been proposed wherein row replacement or column replacement is carried out for a check matrix to convert the check matrix into another check matrix which can be represented by a combination of component matrices such as P×P unit matrices, quasi-unit matrices wherein one or more 1s among components of the unit matrix are changed into 0, a shift matrix obtained by cyclically shifting the unit matrix or quasi-unit matrix, a sum matrix which is the sum of a plurality of ones of unit matrices, quasi-with matrices and shift matrices or a P×P zero matrix. By the configuration, it is possible to carry out updating of a message from a check node to a variable node in decoding of LDPC codes and carry out calculation for updating of a message from a variable node into a check node parallelly for P messages. The configuration described is disclosed, for example, in Japanese Patent Laid-Open No. 2004-343170 (hereinafter referred to as Patent Document 1). With the configuration, it is possible to suppress the circuit scale within a range within which it can be implemented while the number of clocks to be used for decoding is suppressed. In the case of the configuration, the time required for decoding is $2 \times N_H \times N_j \times T_S/P$. Where a check matrix is represented by such a combination of component matrices as described above, a matrix of M/P rows and N/P columns wherein each component matrix which is a zero matrix is replaced by 0 and each component matrix which is not a zero matrix is replaced by 1 is called weight matrix.

However, the technique of the Non-Patent Document 4 has a problem in that an increased circuit scale is necessary because it is necessary to carry out calculation for message updating at all nodes parallelly. Further, according to the technique, since connection between nodes is established by wiring lines, there is a problem that it is difficult to share a decoder among a plurality of check matrices.

Further, in the case of the Layered BP decoding method, a configuration may be used wherein a plurality of logarithmic posteriori probability ratios $q_n$ which satisfy, $h_{mn}=1$ in each row of a check matrix are read out at a time and calculation for message updating for one row of the check matrix is carried out in parallel. However, in order to implement this configuration, a selector is necessary which stores logarithmic posteriori probability ratios $q_n$ into registers and select a plurality of logarithmic posteriori probability ratios $q_n$ which satisfy $h_{mn}=1$ in each row, for example, from a number of logarithmic posteriori probability ratios $q_n$ equal to the code length, that is, equal to N. Generally, since the code length of LDPC codes is as great as several thousands to several tens thousands, it is estimated that the configuration needs an increased circuit scale.

Further, depending upon an application to be incorporated in a case wherein it is used for a next generation radio LAN or the like, the required latency is so severe that it may not be satisfied even by the configuration of Patent Document 1.

SUMMARY

Therefore, it is desirable to provide a decoding apparatus which can execute a decoding process for LDPC codes at a high speed with a simple configuration.

According to an embodiment, there is provided a decoding apparatus for decoding low density parity check codes, including a plurality of storage sections configured to store logarithmic likelihood ratios or logarithmic posteriori probability ratios for one codeword into addresses thereof which are independent of each other thereamong, and a readout section configured to simultaneously read out, from among the logarithmic likelihood ratios or logarithmic posteriori probability ratios for the one codeword stored in the storage sections, a plurality of ones of the logarithmic likelihood ratios or logarithmic posteriori probability ratios which correspond to non-zero value elements in a predetermined one row of the check matrix used in a coding process of the low density parity check codes.

The number of the storage sections may be smaller than a maximum value of a row weight of the check matrix.

In this instance, the readout time number necessary to read out all of those of the logarithmic likelihood ratios or logarithmic posteriori probability ratios which correspond to the non-zero values in an arbitrary row of the check matrix from the storage sections may be a number obtained by rounding a value obtained by dividing the maximum value of the row weight of the check matrix by the number of the storage sections upwards into a digital value.

In this instance, the decoding apparatus may further include a storage position determination section configured to store the logarithmic likelihood ratios or logarithmic posteriori probability ratios for the one codeword into the storage sections such that all of those of the logarithmic likelihood ratios or logarithmic posteriori probability ratios which correspond to the non-zero value elements in an arbitrary row of the check matrix can be read out from the storage sections by a number of times of reading out obtained by dividing the maximum value of the row weight of the check matrix by the number of the storage sections upwards into a digital value.

In this instance, the decoding apparatus may be configured such that each of the storage sections has a number of addresses which corresponds to a value obtained by dividing the code length of the low density parity check codes or the number of columns of a weight matrix of the check matrix by the number of the storage section, or a value obtained by adding one to the thus obtained value or else a value obtained by subtracting one from the obtained value, and the logarithmic likelihood ratios or logarithmic posteriori probability ratios for the one codeword are individually stored into the storage sections.

In this instance, the decoding apparatus may be configured such that the storage position determination section produces storage position determination information for specifying one of the storage sections and the address in which each of the logarithmic likelihood ratios or logarithmic posteriori probability ratios for the one codeword is stored, and the readout section simultaneously reads out a plurality of ones of the logarithmic likelihood ratios or logarithmic posteriori probability ratios based on the storage position determination information.

Where the check matrix includes a plurality of small matrices having P rows and P columns, P ones of the logarithmic likelihood ratios or logarithmic posteriori probability ratios which correspond to P elements of each small pixel may be stored into one address of one of the storage sections.

In the decoding apparatus, logarithmic likelihood ratios or logarithmic posteriori probability ratios for one codeword are stored into addresses which are independent of each other. Then, from among the logarithmic likelihood ratios or logarithmic posteriori probability ratios for the one codeword stored in the storage sections, a plurality of ones of the logarithmic likelihood ratios or logarithmic posteriori probability ratios which correspond to non-zero value elements in a predetermined one row of the check matrix used in a coding process of the low density parity check codes are read out simultaneously.

With the decoding apparatus, a decoding process of low density parity check codes can be executed at a high speed with a simple configuration.

Additional features and advantages are described herein, and will be apparent from the following Detailed Description and the figures.

DETAILED DESCRIPTION

According to an embodiment, there is provided a decoding apparatus for decoding low density parity check (LDPC) codes, including a plurality of storage means (for example, RAMs 100 to 103 shown in FIG. 4) for storing logarithmic likelihood ratios or logarithmic posteriori probability ratios for one codeword into addresses thereof which are independent of each other thereamong, and readout means (for example, a decoding section 202 shown in FIG. 5 which executes a process at step S203 of FIG. 9) for simultaneously reading out, from among the logarithmic likelihood ratios or logarithmic posteriori probability ratios for the one codeword stored in the storage means, a plurality of ones of the logarithmic likelihood ratios or logarithmic posteriori probability ratios which correspond to non-zero value elements in a predetermined one row of the check matrix used in a coding process of the low density parity check codes.

Figure 5:
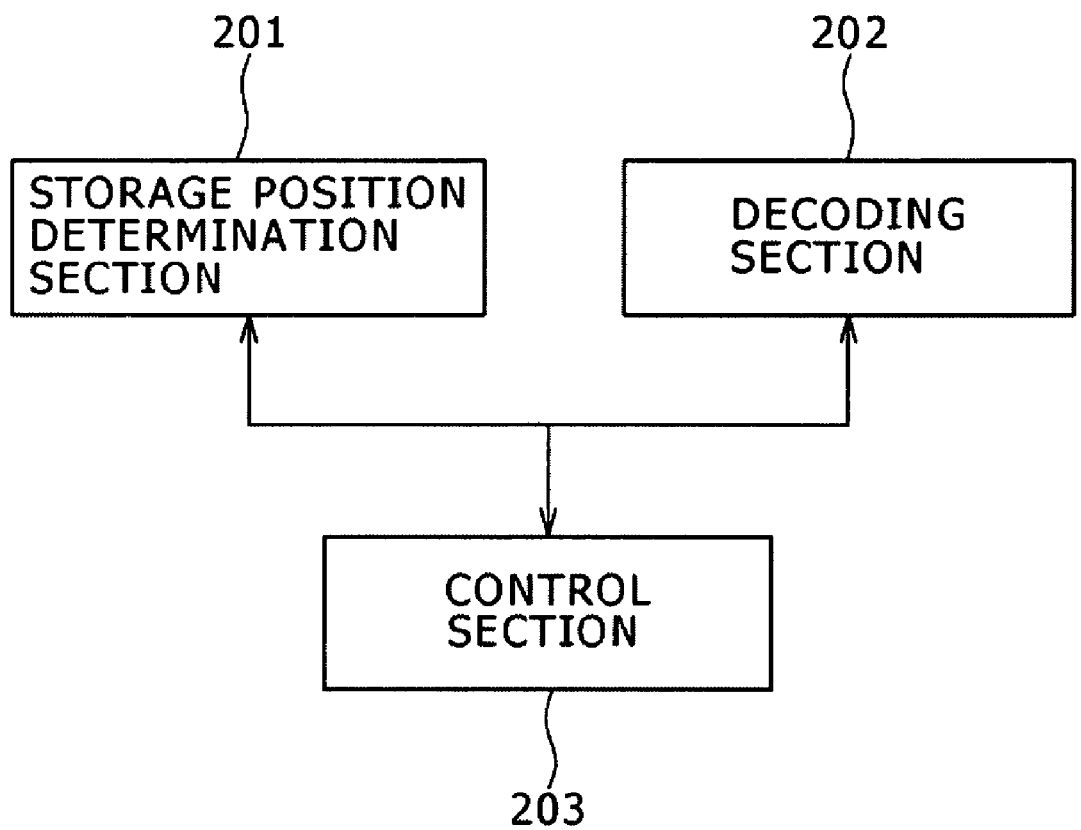
FIG. 5 is a block diagram showing an example of a functional configuration of software executed by a controller shown in FIG. 4.

The decoding apparatus may further include storage position determination means (for example, a storage position determination section 201 shown in FIG. 5) for storing the logarithmic likelihood ratios or logarithmic posteriori probability ratios for the one codeword into the storage means such that all of those of the logarithmic likelihood ratios or logarithmic posteriori probability ratios which correspond to the non-zero value elements in an arbitrary row of the check matrix can be read out from the storage means by a number of times of reading out obtained by dividing the maximum value of the row weight of the check matrix by the number of the storage means upwards into a digital value.

In the following, embodiments of the present application are described with reference to the accompanying drawings.

First, decoding of LDPC (Low Density Parity Check) codes used in the present embodiment is described.

LDPC codes are a system of error correction coding and decoding of low density parity check codes used, for example, in the field of communication including mobile communication and deep space communication and the field of broadcasting including ground wave or satellite digital broadcasting.

As a theoretical limit to the code performance, the Shannon limit is known which is given by the channel coding theory of Shannon (C. E. Shannon). The search regarding the code theory is being carried out in order to develop codes which indicate a performance proximate to the Shannon limit.

In recent years, as a coding method which exhibits a performance proximate to the Shannon limit, a technique called turbo coding such as, for example, parallel concatenated convolutional codes (PCCC) or serially concatenated convolutional codes (SCCC) has been developed. While such turbo coding is developed, attention is being paid to LDPC codes which are a coding method known for long.

It is being discovered by research in recent years that, as the code length of the LDPC codes increases, a performance closer to the Shannon limit is obtained similarly with the turbo codes and so forth. Further, since the LDPC codes have a nature that the minimum distance increases in proportion to the code length, they have a characteristic that they exhibit a good probability property and are advantageous also in that an error floor phenomenon which is observed from a decoding characteristic of the turbo codes and so forth little occurs with the LDPC codes.

The LDPC codes are linear codes defined by a sparse parity check matrix H which includes a very small number of non-zero value elements, and those codes wherein the number of non-zero value elements is fixed among rows and columns of the check matrix H are called regular LDPC codes while those codes other than the codes described are called irregular LDPC codes.

In the following: description is given taking two-dimensional LDPC codes as an example. Coding of LDPC codes is implemented by generating a generation matrix G based on a check matrix H and multiplying the generation matrix G by a two-dimensional information message so as to generate a codeword. In particular, a coding apparatus which carries out coding according to LDPC codes first calculates a generation matrix G which satisfies an expression $G \cdot H^T = 0$ together with a transposed matrix $H^T$ of the check matrix H. Here, where the generation matrix G is a K×N matrix, the coding apparatus multiplies the generation matrix G by an information message (vector s) formed from K bits to produce a vector c (=s·G) of a codeword formed from N bits. The codeword generated by the coding apparatus is mapped such that, for example, each code bit whose value is "0" is mapped to "+1" and each code bit whose value is "1" is mapped to "−1" and transmitted in the thus mapped state, and is received by the receiver side through a predetermined communication path.

Where the check matrix is represented by H, the generation matrix by G, the vector of K information bits by s and the vector of a codeword of N bits by c, coding of LDPC codes is carried out in accordance with the following expression (1):

$$c = S \cdot G \tag{1}$$

Meanwhile, decoding of LDPC codes can be carried out by an algorithm proposed as probabilistic decoding by Gallager, which is a message passing algorithm according to the belief propagation on a Tanner graph which includes variable nodes also called message nodes and check nodes.

As a representative one of decoding methods for LDPC codes, a sum-product decoding method is available. This is basically equivalent to an algorithm known as Belief Propagation.

Figures 1, 2, 3:
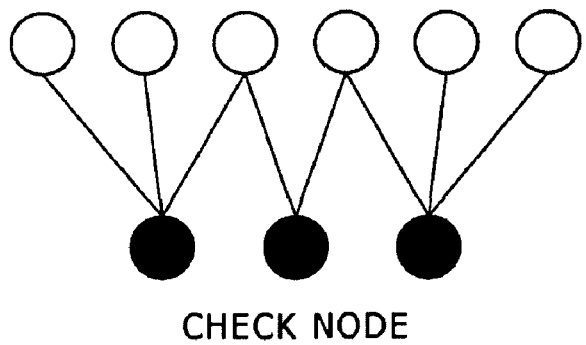
FIG. 1 is a diagrammatic view showing an example of a Tanner graph.
FIG. 2 is a schematic view illustrating an example of inappropriate storage positions of RAMs.
FIG. 3 is a schematic view illustrating an example of appropriate storage positions of RAMs.

Here, the Tanner graph is represented by FIG. 1 where the check matrix H is given as an expression (2) below, and a node indicated by a blank circuit on the upper side in FIG. 1 is called variable node while a node indicated by a dark circuit on the lower side in FIG. 1 is called check node. Each variable node corresponds to a column of the check matrix H, and each check node corresponds to a row of the check matrix H. While the target of the algorithm is to determine a posteriori probability corresponding to each transmission symbol from reception values, since generally a Tanner graph of LDPC codes includes a loop, an accurate posteriori probability cannot be calculated by the BP but approximate calculation is used. However, it is known that, where the graphs are sparse, the approximation technique provides a comparatively good result.

$$H = \begin{bmatrix} 1 & 1 & 1 & 0 & 0 & 0 \\ 0 & 0 & 1 & 1 & 0 & 0 \\ 0 & 0 & 0 & 1 & 1 & 1 \end{bmatrix} \quad (2)$$

Here, a procedure of the sum-product decoding method for two-dimensional LDPC codes is described.

It is assumed that a vector c is a two-dimensional LDPC code of a code length N and an check symbol number M and is defined by a check matrix H represented by the expression (3) given below. It is to be noted that, in the description given below, the symbol "←" or "→" represents substitution of a value into a variable or the like, and the symbol "≡" represents a definition of a predetermined value, a variable or the like.

$$H = \begin{bmatrix} h_{11} & h_{12} & \ldots & h_{1n} & \ldots & h_{1,N} \\ h_{21} & h_{22} & \ldots & h_{2n} & \ldots & h_{2,N} \\ \vdots & \vdots & \ddots & \vdots & \ddots & \vdots \\ h_{m1} & h_{m2} & \ldots & h_{mn} & \ldots & h_{mN} \\ \vdots & \vdots & \ddots & \vdots & \ddots & \vdots \\ h_{M,1} & h_{M,2} & \ldots & h_{M,n} & \ldots & h_{M,N} \end{bmatrix} \quad (3)$$

Where $h_{mn}$ is the element on the mth row and the nth column of the check matrix H, and the variables m and n are integers which satisfy $1 \leq m \leq M$ and $1 \leq n \leq N$, respectively.

For example, where the logarithmic likelihood ratio of the nth bit from the logarithmic likelihood ratio vector $\Lambda = [\lambda_1 \lambda_2 \ldots \lambda_n \ldots \lambda_N]$ for one codeword obtained from a reception signal is represented by $\lambda_n$, a message sent from the mth check node to the nth variable node is represented by $\alpha_{mn}$ and a message sent from the nth variable node to the mth check node is represented by $\beta_{mn}$, in the sum-product decoding method, processes at steps A1 to A6 given below are carried out to perform decoding.

Here, the logarithmic likelihood ratio $\lambda_n$ is defined as given by the following expression (4). Meanwhile, P(x|y) represents a conditional probability where the original transmission signal is x when the reception signal is y. Further, where the transmission line can be assumed as an AWGN (Additive white Gaussian Noise) communication path and the dispersion of the noise is represented by $\sigma^2$, the logarithmic likelihood ratio $\lambda_n$ can be represented as given by the following expression (5).

$$\lambda_n \equiv \ln \frac{P(x_n = 0 \mid y_n)}{P(x_n = 1 \mid y_n)} \quad (4)$$

$$\lambda_n = \frac{2y_n}{\sigma^2} \quad (5)$$

Step A1: Initialization

The message $\alpha_{mn}$ is set to 0 for all sets (m, n) which satisfy $h_{mn}=1$. Further, a loop counter 1 is set to 1. From the received word vector $y=[y_1 y_2 \ldots y_n \ldots y_N]$, the logarithmic likelihood ratio i, is calculated in accordance with the expression (5) given above for all n.

Step A2: Variable Node Process

The mth message $\beta_{mn}$ is calculated in accordance with the expression (6) given below for all sets (m, n) which satisfy $h_{mn}=1$. Here, a set of numbers of check nodes to be connected to the nth variable node is represented by B(n).

$$\beta_{mn} \leftarrow \lambda_n + \sum_{m' \in B(n) \backslash m} \alpha_{m'n} \quad (6)$$

Step A3: Check Node Process

The message $\alpha_{mn}$ is calculated in accordance with the expression (7) given below for all sets (m, n) which satisfy $h_{mn}=1$. Here, a set of numbers of variable nodes to be connected to the mth check node is represented by A(m).

$$\alpha_{mn} \leftarrow \left( \prod_{n' \in A(m) \backslash n} \text{sign}(\beta_{mn'}) \right) \cdot f\left( \sum_{n' \in A(m) \backslash n} f(|\beta_{mn'}|) \right) \quad (7)$$

where $$\text{sign}(x) \equiv \begin{cases} 1, & x \geq 0 \\ -1, & x < 0 \end{cases} \quad (8)$$

$$f(x) = \ln \frac{\exp(x) + 1}{\exp(x) - 1} \quad (9)$$

Step A4: Determination of an Estimated Codeword

The expression (10) given below is calculated for all n within the range of $1 \leq n \leq N$, and the expression (11) given below is calculated using a value $q_n$ obtained based on the expression (10) to determine an estimated codeword vector c hat (which is represented as c_h in the preset specification but is represented, in numerical expressions, as a character c with a mark ^ added thereabove)=[c_h$_1$ c_h$_2$ ... c_h$_n$ ... c_h$_N$]. Here, $q_n$ in the expression (10) is the logarithmic posteriori probability ratio.

$$q_n \leftarrow \lambda_n + \sum_{m' \in B(n)} \alpha_{m'n} \quad (10)$$

$$\hat{c}_n \leftarrow \begin{cases} 0, & \text{if sign}(q_n) = 1 \\ 1, & \text{if sign}(q_n) = -1 \end{cases} \quad (11)$$

Step A5: Parity Check

If the estimated codeword vector c_h=[c_h$_1$ c_h$_2$ ... c_h$_n$ ... c_h$_N$] satisfies the expression (12) given below, then the estimated codeword vector c_h=[c_h$_1$ c_h$_2$ ... c_h$_n$ ... c_h$_N$] is outputted as an estimated codeword, and the processing is ended.

$$[\hat{c}_1 \hat{c}_2 \ldots, \hat{c}_N] \cdot H^T = 0 \quad (12)$$

Step A6: Incrementing of the Counter

If $1 \leq \text{lmax}$ is satisfied, then 1 is incremented as $1 \leftarrow 1+1$, and then the processing returns to step A2. On the other hand, if $1 \leq \text{lmax}$ is not satisfied, then estimated codeword vector $c\_h = [c\_h_1 \, c\_h_2 \ldots c\_h_n \ldots c\_h_N]$ is outputted as an estimated codeword, and the processing is ended. It is to be noted that decoding by the sum-product decoding method is disclosed in detail in Non-Patent Document 2 mentioned hereinabove.

Also an algorithm (Layered BP algorithm) has been proposed by which, by carrying out, for each row, the updating procedure of the logarithmic posteriori probability ratios $q_n$ by the sum-product decoding method described above, even if the iteration time number is small, a performance equal to that of the normal sum-product decoding method can be implemented and also the memory amount can be reduced. In the Layered BP (algorithm) decoding method, decoding is carried out by carrying out processes at the following steps B1 to B5.

Step B1: Initialization

The message $\alpha_{mn}$ is set to 0 for all sets (m, n) which satisfy $h_{mn}=1$. Further, the loop counter 1 is set to 1. From a received word vector $y=[y_1 \, y_2 \ldots y_n \ldots y_N]$, the logarithmic likelihood ratio $\lambda_n$ is calculated in accordance with the expression (5) given hereinabove for all n within the range of $1 \leq n \leq N$ and is substituted into the logarithmic posteriori probability ratio $q_n$.

Step B2: Variable Node-Check Node Process for Each Row of the Check Matrix

The expressions (13) to (15) given below are calculated successively for all sets (m, n) which satisfy $h_{mn}=1$ for each row of the check matrix. In particular, the expression (14) is calculated using the value of $\beta_n$ determined from the expression (13), and the expression (15) is calculated using $\alpha_{mn}$ determined from the expression (14). Then, the logarithmic posteriori probability ratio $q_n$ is updated for each row of the check matrix H.

$$\beta_n \leftarrow q_n - \alpha_{mn} \quad (13)$$

$$\alpha_{mn} \leftarrow \left( \prod_{n' \in A(m) \backslash n} \text{sign}(\beta_{n'}) \right) \cdot f\left( \sum_{n' \in A(m) \backslash n} f(|\beta_{n'}|) \right) \quad (14)$$

$$q_n \leftarrow \beta_n + \alpha_{mn} \quad (15)$$

Step B3: Determination of an Estimated Codeword

The expression (11) given hereinabove is calculated for all n within the range of $1 \leq n \leq N$ using the logarithmic posteriori probability ratios $q_n$ obtained as a result of the process at step B2 so as to obtain the estimated codeword vector $c\_h = [c\_h_1 \, c\_h_2 \ldots c\_h_n \ldots c\_h_N]$.

Step B4: Parity Check

If the estimated codeword vector $c\_h = [c\_h_1 \, c\_h_2 \ldots c\_h_n \ldots c\_h_N]$ satisfies the expression (12), then $c\_h = [c\_h_1 \, c\_h_2 \ldots c\_h_n \ldots c\_h_N]$ is outputted as an estimated codeword, and the processing is ended.

Step B5: Incrementing of the Counter

If $1 \leq \text{lmax}$ is satisfied, then 1 is incremented to $1 \leftarrow 1+1$, and then the processing returns to step S2. If $1 \leq \text{lmax}$ is not satisfied, then $c\_h = [c\_h_1 \, c\_h_2 \ldots c\_h_n \ldots c\_h_N]$ is outputted as an estimated codeword, and then the processing is ended.

In this manner, in the parity check of decoding of LDPC codes, since the product of the transposed matrix of the check matrix H and the estimated codeword is mathematically operated as represented by the expression (12), and it is decided whether or not a result of the mathematic operation is 0. Therefore, it is necessary to extract bits of the estimated codeword corresponding to the position of elements of the non-zero value ("1") in each row of the check matrix H, that is, corresponding to (m, n) which satisfies $h_{mn}=1$, and logically operate exclusive ORing between the extracted bits.

Then, if the product of the transposed matrix of the check matrix H and the estimated codeword is not 0, then the variable node process and the check node process are carried out again, and the logarithmic posteriori probability ratio $q_n$ is mathematically operated again and updated. At this time, the logarithmic posteriori probability ratio $q_n$ mathematically operated and updated again may be only those logarithmic posteriori probability ratios $q_n$ which correspond to bits used for mathematic operation of exclusive ORing described above, that is, only those logarithmic posteriori probability ratios $q_n$ corresponding to (m, n) which satisfy $h_{mn}=1$ in each row of the check matrix H.

In this manner, where decoding of LDPC codes is carried out, in order to update the logarithmic posteriori probability ratios $q_n$, it is necessary to carry out mathematic operation process of the expressions (6) to (7) and (13) to (15) for each row of the check matrix H. Therefore, an effective decoding process may not be implemented if only those logarithmic likelihood ratios $\lambda_n$ or logarithmic posteriori probability ratios $q_n$ which satisfy $h_{mn}=1$ cannot be selected and extracted from among the N logarithmic likelihood ratios $\lambda_n$ ($1 \leq n \leq N$) or N logarithmic posteriori probability ratios $q_n$ ($1 \leq n \leq N$) for each row of the check matrix H which includes M rows.

Accordingly, for example, where a decoding apparatus is configured so as to decode LDPC codes, a selector is provided in related art which selects and outputs those logarithmic likelihood ratios $\lambda_n$ or logarithmic posteriori probability ratios $q_n$ which satisfy $h_{mn}=1$ from among N logarithmic likelihood ratios $\lambda_n$ ($1 \leq n \leq N$) or N logarithmic posteriori probability ratios $q_n$ ($1 \leq n \leq N$) stored in a memory, registers or the like for each of M rows of the check matrix H.

For example, where the decoding latency of the decoding apparatus has a sufficient margin, N logarithmic likelihood ratios $\lambda_n$ or N logarithmic posteriori probability ratios $q_n$ may be stored into one RAM (Random Access Memory) and those logarithmic likelihood ratios $\lambda_n$ or logarithmic posteriori probability ratios $q_n$ which satisfy $h_{mn}=1$ in each row of the check matrix H may be read out one by one and used for calculation by designating an address of the RAM. This configuration is hereinafter referred to as configuration A.

However, in the case of the configuration A, the time required for processing necessary to complete the decoding increases. For example, it is assumed that the check matrix H includes $N_H$ sets (m, n) which satisfy $h_{mn}=1$ and the number of repetitions of decoding is $N_I$. In the present case, in order to carry out decoding for M rows of the check matrix H, calculation of the variable node process and the check node process is carried out for $N_H$ elements, and therefore, processing for $2 \times N_H$ clocks is required. Further, since this decoding is repeated by $N_I$ times, where the time interval is represented by $T_S$, then the time required for decoding of the received codeword is $2 \times N_H \times N_I \times T_S$.

For example, if the number of clocks before a codeword received next is all stored into a register or memory is represented by $N_B$, if $N_B > 2 \times N_H \times N_I$, then it is possible to adopt this configuration A. However, if $N_B < 2 \times N_H \times N_I$, then the configuration A cannot be adopted. Further, with the configuration A, if it is desired to decrease the latency, then since the number of clocks for processing necessary to complete the decoding is great, a high operation frequency is required. Therefore, it is not easy to incorporate the configuration A.

As a configuration of a decoding apparatus of the sum-product decoding method, also a configuration which simultaneously carries out calculation of the variable node process and the check node process for M rows of the check matrix H has been proposed. This configuration is hereinafter referred to as configuration B. In the case of the configuration B, since calculation of the variable node process and the check node process for $N_H$ elements for M rows of the check matrix H is individually carried out by one clock, the time required for the decoding is $2 \times N_I \times T_S$. Consequently, the latency can be reduced significantly when compared with that of the configuration A.

However, in the case of the configuration B, since it is necessary to parallelly carry out calculation for M rows of the check matrix H, there is a problem that the circuit scale increases. Further, in the case of the configuration B, it is difficult to implement a decoding apparatus, which executes decoding of LDPC codes having different code lengths, LDPC codes having different coding rates and LDPC codes having different check matrices as a single decoding apparatus. Therefore, the configuration B is considered to have high code dependency.

On the other hand, where a decoding apparatus of the Layered BP decoding method is to be configured, it may be configured such that those logarithmic likelihood ratios $\lambda_n$ or logarithmic posteriori probability ratios $q_n$ which correspond to (m, n) which satisfy $h_{mn}=1$ in each row of the check matrix H are read out at a time and calculation of the variable node process and the check node process for one row of the check matrix H is carried out in parallel. However, in order to implement the configuration just described, a selector is required which successively selects those logarithmic likelihood ratios $\lambda_n$ or logarithmic posteriori probability ratios $q_n$ which satisfy $h_{mn}=1$ in each row from among N (code length) logarithmic posteriori probability ratios $q_n$ stored in registers or the like. Since generally the code length of LDPC codes is so great that several thousands to several ten thousands, if such a configuration as described above is employed, then the circuit scale becomes very great.

Also a configuration has been proposed wherein row replacement or column replacement is carried out for a check matrix to convert the check matrix into a check matrix whose component matrix is, for example, a P×P (P rows and P columns) unit matrix and which can be represented by a combination of component matrices and calculation of the check node process and the variable node process in decoding of LDPC codes is carried out parallelly for P component matrices. This configuration is hereinafter referred to as configuration C. According to the configuration C, the time required to decode a received codeword is $2 \times N_H \times N_I \times T_S / P$. While the configuration C makes it possible to suppress the time required for decoding and also suppress the circuit scale within a range within which it can be implemented, where a very low latency is required as in the case of a next generation radio LAN, a high operation frequency is still required, and it is not easy to incorporate the configuration C.

However, if a configuration which selects a plurality of logarithmic likelihood ratios $\lambda_n$ or logarithmic posteriori probability ratios $q_n$ which correspond to (m, n) which satisfy $h_{mn}=1$ in each row of the check matrix H at the same time in a short period of time is obtained by a simple configuration, then the time required for decoding can be reduced and also the circuit configuration does not become very great.

Therefore, the embodiment of the present application adopts a configuration which does not select the logarithmic likelihood ratios $q_n$ or logarithmic posteriori probability ratios $q_n$ one by one, P by P or for one entire row but selects a plurality of (v or v×P) logarithmic likelihood ratios $\lambda_n$ or logarithmic posteriori probability ratios $q_n$ which correspond to (m, n) which satisfy $h_{mn}=1$ in each row of the check matrix H at the same time in a short period of time.

By such a configuration as described above, for example, when compared with the case of the configuration C, the time required for decoding can be further suppressed, and also it is possible to reduce the circuit configuration when compared with the case of the configuration B.

For example, in order to extract a plurality of logarithmic likelihood ratios $\lambda_n$ or logarithmic posteriori probability ratios $q_n$ from among N logarithmic likelihood ratios $\lambda_n$ and logarithmic posteriori probability ratios $q_n$, a plurality of RAMs are prepared, and one logarithmic likelihood ratio $\lambda_n$ or logarithmic posteriori probability ratio $q_n$ is stored into one address of the RAMs. Or, where a check matrix is formed from component matrices of P rows and P columns, in order to extract data composed of P logarithmic likelihood ratios $\lambda_n$ or logarithmic posteriori probability ratios $q_n$ at the same time, P logarithmic likelihood ratios $\lambda_n$ or logarithmic posteriori probability ratios $q_n$ are stored into one address of the RAMs.

However, if logarithmic likelihood ratios $\lambda_n$ or logarithmic posteriori probability ratios $q_n$ are stored into a plurality of RAMs simply, for example, in order beginning with the first bit of the received codeword, when the logarithmic likelihood ratios $\lambda_n$ or logarithmic posteriori probability ratios $q_n$ are to be extracted, there is high possibility that simultaneous accessing to different addresses of one RAM may occur. This may make it impossible to read out a plurality of logarithmic likelihood ratios $\lambda_n$ or logarithmic posteriori probability ratios $q_n$ which correspond to (m, n) which satisfy $h_{mn}=1$ simultaneously in a short period of time from all rows of the check matrix H.

This is described using a simple example. For example, from such a check matrix H for encoding or decoding a codeword of a coding rate of ½ and a code length of 24 as represented by, the expression (16) given below, a check matrix H in which 24 logarithmic posteriori probability ratios $q_n$ represented by the expression (17) given below are divisionally stored into four RAMs a to d, that is, successively extracted four by four simultaneously is assumed.

$$H = \begin{bmatrix} 1 & 1 & 0 & 1 & 0 & 1 & 0 & 0 & 0 & 1 & 0 & 0 & 1 & 1 & 0 & 0 & 0 & 0 & 0 & 0 & 0 & 0 & 0 & 0 \\ 1 & 0 & 1 & 1 & 0 & 0 & 1 & 0 & 1 & 0 & 0 & 0 & 0 & 1 & 1 & 0 & 0 & 0 & 0 & 0 & 0 & 0 & 0 & 0 \\ 0 & 0 & 0 & 1 & 1 & 0 & 1 & 0 & 0 & 1 & 0 & 1 & 0 & 0 & 1 & 1 & 0 & 0 & 0 & 0 & 0 & 0 & 0 & 0 \\ 1 & 0 & 0 & 1 & 0 & 0 & 0 & 1 & 0 & 1 & 1 & 0 & 0 & 0 & 0 & 1 & 1 & 0 & 0 & 0 & 0 & 0 & 0 & 0 \\ 1 & 0 & 1 & 0 & 0 & 1 & 1 & 0 & 0 & 1 & 0 & 0 & 0 & 0 & 0 & 0 & 1 & 1 & 0 & 0 & 0 & 0 & 0 & 0 \\ 0 & 1 & 0 & 0 & 0 & 0 & 1 & 0 & 1 & 1 & 0 & 0 & 1 & 0 & 0 & 0 & 0 & 1 & 1 & 0 & 0 & 0 & 0 & 0 \\ 0 & 0 & 0 & 1 & 0 & 0 & 1 & 1 & 0 & 1 & 0 & 1 & 0 & 0 & 0 & 0 & 0 & 0 & 1 & 1 & 0 & 0 & 0 & 0 \\ 1 & 0 & 1 & 0 & 0 & 0 & 1 & 0 & 0 & 1 & 1 & 0 & 0 & 0 & 0 & 0 & 0 & 0 & 0 & 1 & 1 & 0 & 0 & 0 \\ 1 & 1 & 0 & 1 & 0 & 0 & 1 & 0 & 0 & 0 & 0 & 1 & 0 & 0 & 0 & 0 & 0 & 0 & 0 & 0 & 1 & 1 & 0 & 0 \\ 0 & 0 & 0 & 1 & 1 & 0 & 0 & 0 & 1 & 1 & 0 & 0 & 0 & 0 & 0 & 0 & 0 & 0 & 0 & 0 & 0 & 1 & 1 & 0 \\ 1 & 0 & 0 & 1 & 0 & 1 & 0 & 0 & 0 & 0 & 1 & 0 & 0 & 0 & 0 & 0 & 0 & 0 & 0 & 0 & 0 & 0 & 1 & 1 \\ 1 & 0 & 0 & 0 & 1 & 0 & 1 & 1 & 0 & 0 & 0 & 0 & 1 & 0 & 0 & 0 & 0 & 0 & 0 & 0 & 0 & 0 & 0 & 1 \end{bmatrix} \quad (16)$$

$$Q = [\, q_1 \ \ q_2 \ \ q_3 \ \ q_4 \ \ q_5 \ \ q_6 \ \ q_7 \ \ q_8 \ \ q_9 \ \ q_{10} \ \ q_{11} \ \ q_{12} \ \ q_{13} \ \ q_{14} \ \ q_{15} \ \ q_{16} \ \ q_{17} \ \ q_{18} \ \ q_{19} \ \ q_{20} \ \ q_{21} \ \ q_{22} \ \ q_{23} \ \ q_{24} \,] \quad (17)$$

In the present case, since the code length N is N=24, where the logarithmic posteriori probability ratios $q_n$ are divisionally stored into four RAMs, it is necessary for each RAM to have 6 (=24/4) addresses. For example, if the logarithmic posteriori probability ratios $q_n$ are stored in order into the RAMs a to d beginning with the first bit of the codeword, then they are stored in such a manner as seen in FIG. 2.

Then, from among the logarithmic posteriori probability ratios $q_n$ stored in such a manner as seen in FIG. 2, those logarithmic posteriori probability ratios $q_n$ which satisfy $h_{mn}=1$ for each row of the check matrix H are read out.

In the preset case, in the first row of the check matrix H, (m, n)=(1, 1), (1, 2), (1, 4), (1, 6), (1, 10), (1, 13) and (1, 14) satisfy $h_{mn}=1$. Therefore, from among 24 logarithmic posteriori probability ratios $q_n$, $q_1$, $q_2$, $q_4$, $q_6$, $q_{10}$, $q_{13}$ and $q_{14}$ correspond to such seven (m, n) as just mentioned should be read out. However, where logarithmic posteriori probability ratios $q_n$ are stored in such a manner as seen in FIG. 2, $q_2$, $q_6$, $q_{10}$ and $q_{14}$ are stored in the same RAM, that is, the RAM b, and if it is tried, for example, to read out the seven logarithmic posteriori probability ratios $q_n$ in two clocks which are the shortest time when it is tried to read out the seven values from the four RAMs, then two different addresses must be accessed simultaneously such that, for example, the address "1" and the address "2" of the RAM b are read out simultaneously and then the address "3" and the address "4" of the RAM b are read out simultaneously. On the other hand, if it is tried to read out all seven logarithmic posteriori probability ratios $q_n$ without simultaneously accessing to different addresses of the RAM b, then four clocks are required, which is not efficiently.

Now, storage of logarithmic posteriori probability ratios $q_n$ into the RAMs a to d as seen in FIG. 3 is studied. In this instance, $q_1$, $q_2$, $q_4$, $q_6$, $q_{10}$, $q_{13}$ and $q_{14}$ to be read out in the first row of the check matrix H are stored uniformly in all of the four RAMs, and all of seven logarithmic posteriori probability ratios $q_n$ to be read out in the first row of the check matrix H can be read out in two clocks without simultaneously accessing different addresses.

Further, if the logarithmic posteriori probability ratios $q_n$ are stored in the RAMs a to d in such a manner as seen in FIG. 3, then also the logarithmic posteriori probability ratios $q_n$ in the second and succeeding rows of the check matrix H can be read out in two clocks similarly as in the case of the first row.

Accordingly, as seen in FIG. 3, if the storage positions of the logarithmic posteriori probability ratios $q_n$ into the RAM are set suitably so that those logarithmic posteriori probability ratios $q_n$ which are to be read out in each of the first to twelve rows of the check matrix H can all be read out in two clocks or less, then it is possible to read out the logarithmic posteriori probability ratios $q_n$ efficiently at a high speed when compared with that in an alternative case wherein the logarithmic posteriori probability ratios $q_n$ are read out one by one. Further, if the storage positions of the logarithmic posteriori probability ratios $q_n$ into the RAMs are set suitably and stored, then since a desired logarithmic posteriori probability ratio $q_n$ can be extracted by designation of an address, for example, also the necessity for a selector successively selecting the logarithmic posteriori probability ratios $q_n$ corresponding to (m, n) which satisfy $h_{mn}=1$ from among a plurality of logarithmic posteriori probability ratios $q_n$ is eliminated.

It is to be noted that the process for suitably setting the storage positions of logarithmic posteriori probability ratios $q_n$ into the RAMs is hereinafter described.

Furthermore, if the storage positions of the logarithmic posteriori probability ratios $q_n$ into the RAMs are set suitably as seen in FIG. 3, then those logarithmic posteriori probability ratios $q_n$ which correspond to (m, n) which satisfy $h_{mn}=1$ for one column are read out in two clocks which are the shortest time period for reading out of each row. Accordingly, since the variable node process and the check node process which are carried out using read out logarithmic posteriori probability ratios $q_n$ are carried out divisionally twice, sharing of the circuit can be achieved. Further, when compared with an alternative configuration wherein the variable node process and the check node process for one row are carried out collectively once, the circuit scale can be reduced to $1/N_{rd}$, in the present case, $N_{rd}=2$.

Where the storage positions of the logarithmic posteriori probability ratios $q_n$ into the RAM are set suitably as seen in FIG. 3, if the code length is represented by N, then the maximum value of the row weight of the check matrix H by $w_{RMax}$, the number of RAMs for storing logarithmic likelihood ratios $\lambda_n$ or logarithmic posteriori probability ratios $q_n$ by $N_{ram}$, the address number of the RAMs by $N_{addr}$ and the number of clocks necessary to extract logarithmic likelihood ratios $\lambda_n$ or logarithmic posteriori probability ratios $q_n$ for one row of the check matrix H by $N_{rd}$, then the expression (18) given below is satisfied. $N_{ram}$ is determined from the operation frequency, check matrix, decoding repetition number and so forth so that the required latency in a system to be mounted may be satisfied. Further, when the check matrix H is represented by a combination of P×P small matrices, in order to place P logarithmic likelihood ratios $\lambda_n$ or logarithmic posteriori probability ratios $q_n$ into one address of each RAM, the apparent code length N' is defined as given by the expression (19) given below. It is to be noted here that, if the apparent code length N' can be divided by $N_{ram}$ and logarithmic likelihood ratios $\lambda_n$ or the logarithmic posteriori probability ratios $q_n$ are placed uniformly into $N_{ram}$ RAMs, then the address number $N_{addr}$ of the RAMs is represented by the expression (20) given below.

$$N_{rd} = \mathrm{ceil}\left(\frac{w_{RMAX}}{N_{ram}}\right) \tag{18}$$

$$N' \equiv \begin{cases} N/P \\ N \end{cases} \tag{19}$$

In expression (19), upper: where H is represented by a combination of P×P matrices
ditto, lower: in any other case $$N_{addr} = \mathrm{ceil}\left(\frac{N'}{N_{ram}}\right) \tag{20}$$

It is to be noted that the maximum value $w_{RMax}$ of the row weight of the check matrix H represents the maximum number of pixels having a non-zero value in an arbitrary row of the check matrix H. For example, since seven "1" elements in the maximum are included per one row of the check matrix H of the expression (16), the maximum value $w_{RMax}$ of the row weight is 7.

Further, where the check matrix H is formed from such a combination of P×P (P rows and P columns) small matrices (in the present case, P=4) having a cyclic structure as represented by the expression (21) given below, the method described hereinabove can be applied if a P×P matrix is regarded as one element $h_{mn}$. In the present example, the check matrix H is formed from a plurality of small matrices partitioned by broken lines. In particular, one section partitioned by broken lines is one small matrix, and the expression

(21) given below is composed of 4×8=32 small matrices, each of which is formed as a 4×4 (four rows and four columns) matrix.

$$H = \begin{bmatrix} 1&0&0&0&|&0&1&0&0&|&0&0&0&0&|&0&0&1&0&|&0&1&0&0&|&1&0&0&0&|&0&0&0&0&|&0&0&0&0 \\ 0&1&0&0&|&0&0&1&0&|&0&0&0&0&|&0&0&0&1&|&0&0&1&0&|&0&1&0&0&|&0&0&0&0&|&0&0&0&0 \\ 0&0&1&0&|&0&0&0&1&|&0&0&0&0&|&1&0&0&0&|&0&0&0&1&|&0&0&1&0&|&0&0&0&0&|&0&0&0&0 \\ 0&0&0&1&|&1&0&0&0&|&0&0&0&0&|&0&1&0&0&|&1&0&0&0&|&0&0&0&1&|&0&0&0&0&|&0&0&0&0 \\ \hline 0&0&0&1&|&0&0&0&0&|&0&0&0&1&|&0&0&0&0&|&0&0&0&0&|&1&0&0&0&|&1&0&0&0&|&0&0&0&0 \\ 1&0&0&0&|&0&0&0&0&|&1&0&0&0&|&0&0&0&0&|&0&0&0&0&|&0&1&0&0&|&0&1&0&0&|&0&0&0&0 \\ 0&1&0&0&|&0&0&0&0&|&0&1&0&0&|&0&0&0&0&|&0&0&0&0&|&0&0&1&0&|&0&0&1&0&|&0&0&0&0 \\ 0&0&1&0&|&0&0&0&0&|&0&0&1&0&|&0&0&0&0&|&0&0&0&0&|&0&0&0&1&|&0&0&0&1&|&0&0&0&0 \\ \hline 0&0&0&0&|&1&0&0&0&|&0&0&0&0&|&0&1&0&0&|&1&0&0&0&|&0&0&0&0&|&1&0&0&0&|&1&0&0&0 \\ 0&0&0&0&|&0&1&0&0&|&0&0&0&0&|&0&0&1&0&|&0&1&0&0&|&0&0&0&0&|&0&1&0&0&|&0&1&0&0 \\ 0&0&0&0&|&0&0&1&0&|&0&0&0&0&|&0&0&0&1&|&0&0&1&0&|&0&0&0&0&|&0&0&1&0&|&0&0&1&0 \\ 0&0&0&0&|&0&0&0&1&|&0&0&0&0&|&1&0&0&0&|&0&0&0&1&|&0&0&0&0&|&0&0&0&1&|&0&0&0&1 \\ \hline 0&0&1&0&|&0&0&0&0&|&0&1&0&0&|&0&0&0&0&|&0&1&0&0&|&0&0&0&0&|&0&0&0&0&|&1&0&0&0 \\ 0&0&0&1&|&0&0&0&0&|&0&0&1&0&|&0&0&0&0&|&0&0&1&0&|&0&0&0&0&|&0&0&0&0&|&0&1&0&0 \\ 1&0&0&0&|&0&0&0&0&|&0&0&0&1&|&0&0&0&0&|&0&0&0&1&|&0&0&0&0&|&0&0&0&0&|&0&0&1&0 \\ 0&1&0&0&|&0&0&0&0&|&1&0&0&0&|&0&0&0&0&|&1&0&0&0&|&0&0&0&0&|&0&0&0&0&|&0&0&0&1 \end{bmatrix} \quad (21)$$

Here, the cyclic structure is a structure from which another matrix is obtained if elements of the matrix are shifted, for example, in a leftward or rightward direction. For example, if all of the elements of the first to fourth rows of the small matrix at the left upper corner of the expression (21) are shifted by one in the rightward direction then resulting small matrix becomes same as small matrix neighboring on the right side of the small matrix.

If the expression (21) is regarded like the expression (22) and the number of logarithmic likelihood ratios $\lambda_n$ or logarithmic posteriori probability ratios $q_n$ to be placed into each RAM is changed from one to four, then it is possible to apply the configuration of the embodiment. However, since it is necessary thereupon to process $N_{ram} \times P$ data in parallel, also the scale of the circuit which carries out the variable node process and the check node process increases to P times.

In the embodiment, a decoding apparatus is implemented which carries out reading out and writing of a plurality of values at a time by divisionally storing the values of messages $\alpha_{mn}$ or logarithmic posteriori probability ratios $q_n$ necessary when the logarithmic posteriori probability ratios $q_n$ for one codeword are updated into a plurality of RAMs.

In the following, an example wherein the embodiment is applied to the Layered BP decoding method is described with reference to the drawings.

Figure 4:
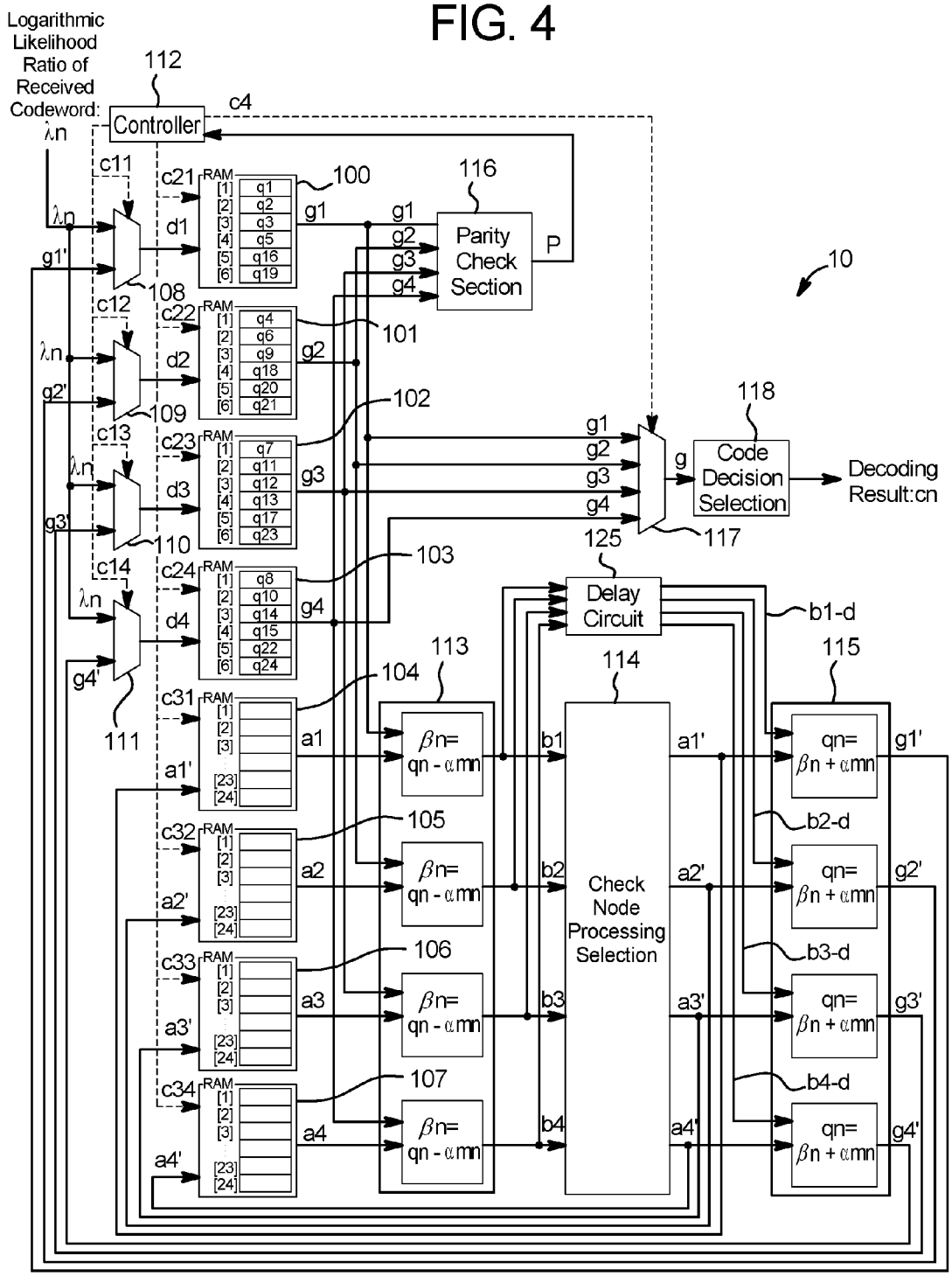
FIG. 4 is a block diagram showing an example of a configuration of a decoding apparatus to which an embodiment is applied.

FIG. 4 is a block diagram showing an example of a configuration of a decoding apparatus to which an embodiment is applied. Referring to FIG. 4, the decoding apparatus 10 shown receives a codeword, for example, transmitted thereto in the form of LDPC codes from another apparatus not shown and carries out error correction and decoding of the received codeword.

Further, the decoding apparatus 10 here decodes a codeword in the form of LDPC codes encoded, for example, using a check matrix H represented by the expression (16). Since the check matrix H indicated by the expression (16) includes 12 rows and 24 columns, the variables m and n representative of a row and a column of the check matrix are integers which satisfy $1 \leq m \leq 12$ and $1 \leq n \leq 24$, respectively.

In the decoding apparatus 10 shown in FIG. 4, the RAM for storing logarithmic likelihood ratios $\lambda_n$ or logarithmic posteriori probability ratios $q_n$ of the received codeword is formed from four RAMS, that is, RAMs 100 to 103. In this instance, since the number $N_{ram}$ of RAMs is $N_{ram}=4$, the address number $N_{addr}$ of each RAM=6 is calculated in accordance with the expression (20). Thus, the number of addresses of the RAMs 100 to 103 is 6, that is, from the address [1] to the address [6].

Meanwhile, since the maximum value $w_{RMax}$ of the row weight of the check matrix H is $w_{RMax}=7$, the clock number $N_{rd}$ necessary to extract logarithmic likelihood ratios $\lambda_n$ or logarithmic posteriori probability ratios $q_n$ for one row of the check matrix H is calculated as $N_{rd}=2$ from the expression (18).

Further, in the example shown, the RAM for storing messages $\alpha_{mn}$ includes four RAMs 104 to 107. In the present case, the number of addresses of each of the RAMs 104 to 107 is 24. that is, from the address [1] to the address [24].

A controller 112 includes a memory and so forth and stores appropriate storage positions of logarithmic likelihood ratios $\lambda_n$ or logarithmic posteriori probability ratios $q_n$ of a received codeword determined in advance as hereinafter described. The controller 112 controls components of the decoding apparatus 10 based on the information stored in the memory.

When decoding is to be carried out by the decoding apparatus 10, a codeword to be decoded is received first, and logarithmic likelihood ratios $\lambda_n$ corresponding to individual bits of the codeword are supplied to switches 108 to 111. Where the code length is 24 bits, 24 logarithmic likelihood ratios $\lambda_n$ are successively supplied in order of $\lambda_1$ to $\lambda_{24}$ to the switches 108 to 111.

At this time, the controller 112 outputs control signals c11 to c14 for controlling the switches 108 to 111 based on the storage positions stored in the internal memory or the like. Consequently, the 24 logarithmic likelihood ratios $\lambda_n$ are outputted as signals d1 to d4 from the switches 108 to 111, respectively, and stored into appropriate addresses of the RAMs 100 to 103.

In the present example, the storage positions of the RAMs 100 to 103 are indicated by $q_1$ to $q_{24}$, and they are similar to the storage positions described hereinabove with reference to FIG. 3. It is to be noted that, when logarithmic posteriori probability ratios $q_n$ are not calculated, that is, when the logarithmic likelihood ratios $\lambda_n$ of the received codeword are to be stored into the RAMs 100 to 103, the logarithmic likelihood ratios $\lambda_1$ to $\lambda_{24}$ are stored into the storage positions indicated by the storage positions $q_1$ to $q_{24}$, respectively.

Then, die controller 112 outputs control signals c21 to c24 based on the storage positions stored in the internal memory or the like and information of the check matrix H to read out logarithmic likelihood ratios $\lambda_n$ corresponding to (m, n) which satisfy $h_{mn}=1$ in the first row of the check matrix H as logarithmic posteriori probability ratios $q_n$ before updated from the RAMs 100 to 103 and supply the logarithmic posteriori probability ratios $q_n$ to a variable node processing section 113. Here, four logarithmic likelihood ratios $\lambda_n$ or four logarithmic posteriori probability ratios $q_n$ in the maximum are read out simultaneously and supplied as signals g1 to g4 to the variable node processing section 113.

It is to be noted that the values of messages $\alpha_{mn}$ are initially stored as the value 0 in the RAMs 104 to 107 or are initialized to 0 before first reading out is carried out, and those messages $\alpha_{mn}$ which are required for mathematical operation are read out as signals a1 to a4 from the RAMs 104 to 107 based on control signals c31 to c34 outputted from the controller 112 and supplied to the variable node processing section 113.

The variable node processing section 113 carries out mathematical operation indicated by the expression (13) to calculate the value of $\ominus_n$ and supplies the calculated value of $\beta_n$ as signals b1 to b4 to a check node processing section 114 and a delay circuit 125. Here, the variable node processing section 113 carries out mathematical operation simultaneously for the logarithmic likelihood ratios $\lambda_n$ (logarithmic posteriori probability ratios $q_n$ before updated) read out simultaneously from the RAMs 100 to 103.

The check node processing section 114 carries out mathematical operation represented by the expression (14) to update the messages $\alpha_{mn}$. The updated messages $\alpha_{mn}$ are supplied as signals a1' to a4' to an arithmetic unit 115 and the RAMs 104 to 107 so as to update the values of the messages $\alpha_{mn}$ stored in the RAMs 104 to 107, respectively.

The delay circuit 125 delays the signals b1 to b4 by a delay amount caused by the calculation for updating of the messages A in the check node processing section 114.

The arithmetic unit 115 carries out mathematical operation represented by the expression (15) to calculate updated logarithmic posteriori probability ratios q. Here, a number of logarithmic posteriori probability ratios $q_n$ corresponding to the value of $\beta_n$ and the updated messages $\alpha_{mn}$ supplied simultaneously from the delay circuit 125 and the check node processing section 114 are calculated and supplied as signals g1' to g4' to the switches 108 to 111, respectively.

At this time, the controller 112 outputs the control signals c11 to c14 based on the storage positions stored in the internal memory or the like and outputs the updated logarithmic posteriori probability ratios $q_n$ as signals d1 to d4 from the switches 108 to 111, respectively. The signals d1 to d4 are stored into appropriate addresses of the RAMs 100 to 103 to update the values stored in the RAMs 100 to 103. This operation is carried out for all rows of the check matrix H to update the 24 logarithmic posteriori probability ratios $q_n$.

After all of the logarithmic likelihood ratios $\lambda_n$ or logarithmic posteriori probability ratios $q_n$ which correspond to (m, n) which satisfy $h_{mn}=1$ for one row of the check matrix H are read out and logarithmic posteriori probability ratios $q_n$ updated by the processes of the variable node processing section 113 to arithmetic unit 115 are calculated, the values of the logarithmic posteriori probability ratios $q_n$ stored in the RAMs 100 to 103 are read out and supplied to a parity check section 116. It is to be noted that, as described hereinabove, the logarithmic likelihood ratios $\lambda_n$ or logarithmic posteriori probability ratios $q_n$ which correspond to (m, n) which satisfy, $h_{mn}=1$ for one row of the check matrix H are all read out by reading out operation by $N_d(=two)$ times.

The parity check section 116 carries out the processes at steps B3 and B4 of the Layered BP decoding method described hereinabove to generate a signal p representative of a result (OK or NG) of the parity check and supplies the signal p to the controller 112.

When the signal p representative of a result of NG is supplied from the parity, check section 116, the controller 112 outputs control signals c21 to c24 and control signals c31 to c34 based on the storage positions stored in the internal memory or the like and the information of the check matrix H to read out those logarithmic posteriori probability ratios $q_n$ which correspond to (m, n) which satisfy $h_{mn}=1$ in the first row of the check matrix H from within the RAMs 100 to 103 and further reads out messages $\alpha_{mn}$ corresponding to the logarithmic posteriori probability ratios $q_n$ from the RAMs 104 to 107. Then, the controller 112 supplies the logarithmic posteriori probability ratios $q_n$ and the messages $\alpha_{mn}$ to the variable node processing section 113. Consequently, the values stored in the RAMs 100 to 103 are further updated.

On the other hand, if the signal p representative of a result of OK is supplied from the parity check section 116, then the controller 112 outputs the control signal c4 so that logarithmic posteriori probability ratios $q_n$ for one codeword are outputted from a switch 117 to a sign decision section 118.

Then, the sign decision section 118 decides whether the signal supplied has the positive sign or the negative sign. Then, for example, if the sign is the positive sign, then the signal is mapped to "0", but if the sign is the negative sign, then the signal is mapped to "1", and such data for one codeword, that is, for 24 bits, as a result of the decoding, is outputted.

FIG. 5 shows an example of a functional configuration of the controller 112.

Referring to FIG. 5, the controller 112 shown includes a storage position determination section 201 which controls a process of determining the storage positions of logarithmic likelihood ratios $\lambda_n$ or logarithmic posteriori probability ratios $q_n$ in the RAMs 100 to 103, for example, IDs for specifying the RAMs.

The storage positions determined by the storage position determination section 201 are supplied to a control section 203 and stored into an internal memory of the controller 112 or the like.

A decoding section 202 controls a process of reading out the logarithmic likelihood ratios $\lambda_n$ or logarithmic posteriori probability ratios $q_n$ stored in the RAMs 100 to 103 based on the storage positions determined by the storage position determination section 201 and decoding a received codeword. In particular, the decoding section 202 causes the decoding apparatus 10 to execute the processes at the steps B1 to B5 of the Layered BP decoding method described above.

The control section 203 issues, for example, an instruction to execute a process to the storage position determination section 201 and the decoding section 202 thereby to control various processes such as production of a control signal for controlling die components of the decoding apparatus 10. The control section 203 stores storage positions determined by the storage position determination section 201 and a check matrix H set in advance into the internal memory or the like. Then, the control section 203 reads out the storage positions or the check matrix H from the memory and supplies the read out storage positions or check matrix H to the storage position determination section 201 or decoding section 202.

It is to be noted here that, while it is described above that the storage position determination section 201 is provided as a functional block of the controller 112, the storage position determination section 201 need not necessarily be provided in the decoding apparatus 10. For example, a functional block equivalent to the storage position determination section 201 may be provided in an apparatus different from the decoding apparatus 10 such as, for example, a personal computer such that information of the storage positions determined by the functional block is transmitted to the decoding apparatus 10, for example, by communication so that the storage positions may be stored into the internal memory of the controller 112 of the decoding apparatus 10.

Figure 6:
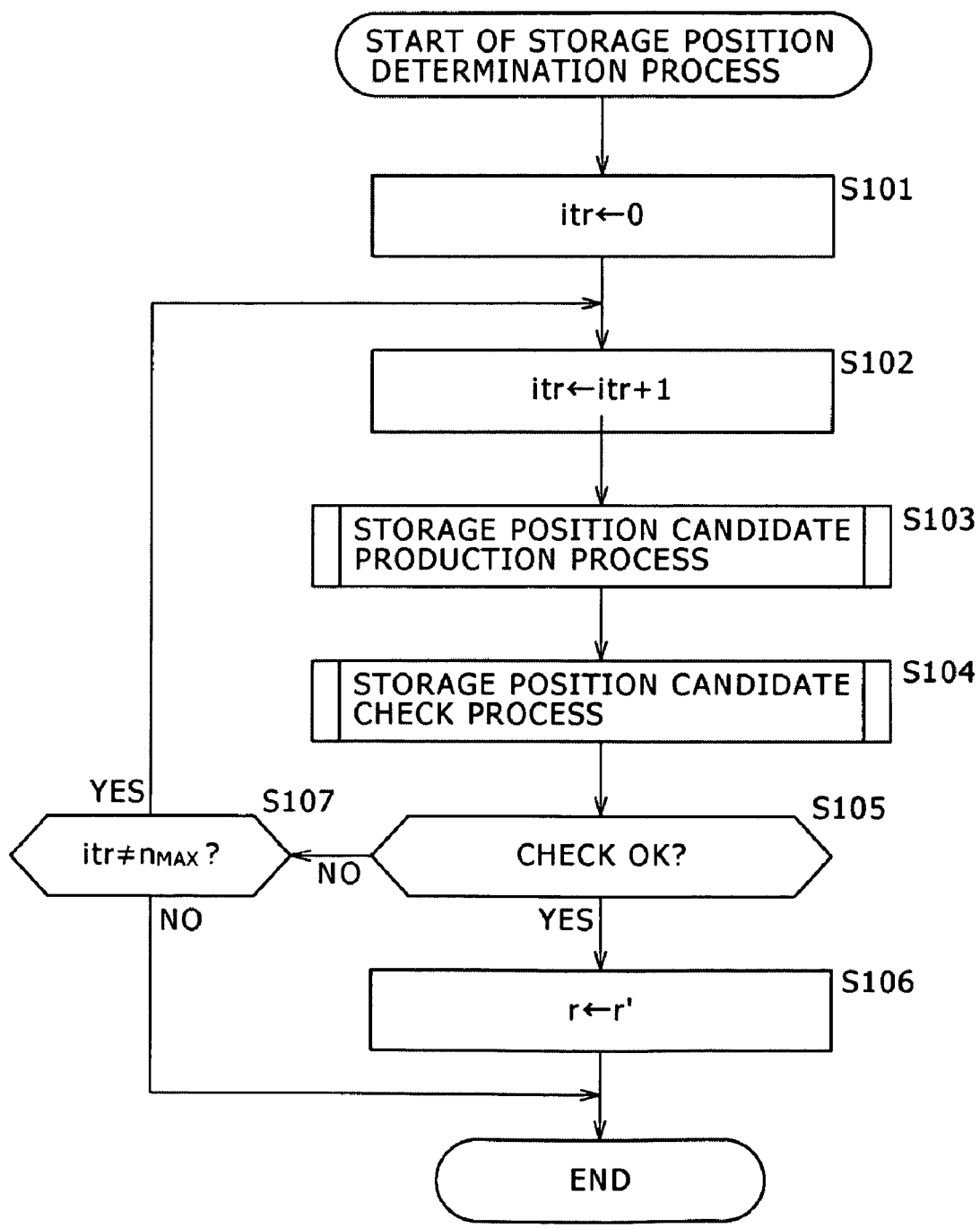
FIG. 6 is a flowchart illustrating an example of a storage position determination process.

FIG. 6 is a flowchart illustrating a storage position determination process for appropriately setting the storage positions of the RAMs 100 to 103 into which the logarithmic likelihood ratios $\lambda_n$ or logarithmic posteriori probability ratios $q_n$ are to be stored. By executing this process, the decoding apparatus 10 finds out into What address of which one of the RAMs each of the logarithmic likelihood ratios $\lambda_n$ or logarithmic posteriori probability ratios $q_n$ should be stored in order to extract the logarithmic likelihood ratios $\lambda_n$ or logarithmic posteriori probability ratios $q_n$ in a short period of time when decoding is carried out. In particular, as the process described is executed, such storage positions as described hereinabove with reference to FIG. 3 are determined. Here, this process is executed, for example, by an apparatus separate from the decoding circuit or the like in advance, and the storage positions determined by this process are stored into the internal memory of the controller 112.

Here, to each of a plurality of RAMs for storing logarithmic likelihood ratios $\lambda_n$ or logarithmic posteriori probability ratios $q_n$ such as, for example, four RAMs (RAMs 100 to 103), a number such as, for example, 1, 2, 3 or 4 is allocated. Storage position candidates $r'=[r'_1 \, r'_2 \ldots r'_i \ldots r'_{N'}]$ used in the following description indicate in which one of the RAMs a logarithmic posteriori probability ratio $q_n$ is stored. For example, $r'_8=4$ represents that data of the logarithmic posteriori probability ratio $q_8$ is to be stored into the RAM of the number "4", that is, the RAM 103.

Referring to FIG. 6, first at step S101, the storage position determination section 201 initializes a variable itr, which counts the generation number of storage position candidates to a plurality of RAMs, to 0.

At step S102, the variable itr is incremented by 1.

At step S103, the storage position determination section 201 executes a storage position candidate production process, which is hereinafter described with reference to FIG. 7, to produce storage position candidates $r'=[r'_1 \, r'_2 \ldots r'_i \ldots r'_{N'}]$ for the first time. In the present case, since the code length N is 24, also the apparent code length N' is 24 from the expression (19). Accordingly, storage position candidates $r'_1$ to $r'_{24}$ are produced.

At step S104, the storage position determination section 201 executes a storage position candidate check process, which is hereinafter described with reference to FIG. 8. Consequently, where N logarithmic likelihood ratios $\lambda_n$ or N logarithmic posteriori probability ratios $q_n$ are stored into the first time storage position candidates $r'=[r'_1 \, r'_2 \ldots r'_i \ldots r'_{N'}]$ produced by the process at step S103, it is decided whether or not those logarithmic likelihood ratios $\lambda_n$ or logarithmic posteriori probability ratios $q_n$ which correspond to (m, n) which satisfy $h_{mn}=1$ can be read out in $N_{rd}$ clocks or less.

In the present case, since the number of RAMs (RAMs 100 to 103) is four, $N_{ram}=4$, and since the address number $N_{addr}$ is $N_{addr}=6$ and the maximum value $w_{RMax}$ of the row weight is $w_{RMax}=7$, the clock number $N_{rd}$ necessary to extract the logarithmic likelihood ratios $\lambda_n$ or logarithmic posteriori probability ratios $q_n$ for one row of the check matrix H is $N_{rd}=2$ from the expression (18). In other words, if it is possible to read out the logarithmic likelihood ratios $\lambda_n$ or logarithmic posteriori probability ratios $q_n$ which correspond to (m, n) which satisfy $h_{mn}=1$ by twice or less, then it is considered that the storage position candidates are storage positions set appropriately as described hereinabove with reference to FIG. 3. Thus, the check result of the storage position candidate check process is OK.

Meanwhile, if the logarithmic likelihood ratios $\lambda_n$ or logarithmic posteriori probability ratios $q_n$ which correspond to (m, n) which satisfy $h_{mn}=1$ cannot be read out in two clocks or less, then the storage position candidates are not considered appropriately set storage positions, but it is considered necessary to produce further storage position candidates. Therefore, the check result of the storage position candidate check process is NG.

After the process at step S104, the storage position determination section 201 decides at step S105 whether or not the check result of the storage position candidate check process is OK. If it is decided that the check result is not OK, that is, the check result is NG, then it is necessary to produce further storage position candidates. Therefore, the processing advances to step S107.

At step S107, it is decided whether or not the variable itr is different from the total number $n_{MAX}$ of candidates. If the variable itr is different from the total number n then since candidates which can be produced still remain, the processing returns to step S102 to carry out production of next candidates.

Then, if storage position candidates $r'=[r'_1 \, r'_2 \ldots r'_i \ldots r'_{N'}]$ for the second time are produced by the process at step S103 and then N logarithmic likelihood ratios $\lambda_n$ or N logarithmic posteriori probability ratios $q_n$ are stored into the storage position candidates r' for the second time, then it is decided at step S105 whether or not those logarithmic likelihood ratios $\lambda_n$ or logarithmic posteriori probability ratios $q_n$ which correspond to (m, n) which satisfy $h_{mn}=1$ can be read out in $N_{rd}$ clocks or less.

In this manner, the processes at steps S107 and S102 to S105 are executed repetitively until it is decided at step S105 that the check result of the storage position candidate check process is OK. If it is decided at step S105 that the check result of the storage position candidate check process is OK, then the storage position candidates r' are set as finally determined storage positions r at step S106, thereby ending the storage position determination process. In this instance, for example, such appropriate storage positions as described hereinabove with reference to FIG. 3 are determined.

If the variable itr coincides with the total number $n_{MAX}$ at step S107, then since this signifies that all candidates are produced, the processing is ended. This signifies that, exceptionally although storage position candidates which can exist as storage positions of logarithmic likelihood ratios $\lambda_n$ or logarithmic posteriori probability ratios $q_n$ are all produced and checked, appropriately set storage positions are not successfully found out.

Now, a detailed example of the storage position candidate production process at step S103 of FIG. 6 is described with reference to a flowchart of FIG. 7.

At step S121, the storage position determination section 201 decides whether or not the variable itr is 1. For example, when storage position candidates for the first time are to be produced by the storage position candidate production process, since the variable itr is 1, the processing advances to step S124.

At step S124, the storage position determination section 201 sets a variable i to 1 and sets a storage position candidate $r'_i$ to 1.

Then, the processing advances to step S123, at which the storage position determination section 201 decides whether or not the value of the storage position candidate $r'_i$ is higher than the RAM number $N_{ram}$. In the present case, since $N_{ram}=4$ and the value of the variable i set by the process at step S124 is 1, the storage position candidate $r'_i$ is $r'_i(=1) \leq N_{ram}(=4)$, and the processing advances to step S125.

At step S125, the value of the variable i is incremented by 1, and then it is decided at step S126 whether or not the variable i is equal to or lower than the apparent code length N'. In the present case, the variable i is $i(=2) \leq N'(=24)$, and the processing advances to step S127.

At step S127, the storage position determination section 201 sets the storage position candidate $r'_i$ to 1. In the present case, the storage position candidate $r'_i$ becomes $r'_2=1$. Then, the processing returns to step S123.

Then, since $r'_2(=1) \leq N_{ram}(=4)$ at step S123, the processing advances from step S123 to steps S125 to S127.

In this manner, the processes at steps S123 and S125 to S127 are executed repetitively, and when the value of the variable i becomes 25, the storage position candidates r' are $r'=[1\ 1\ \ldots\ 1]$, that is, $r'_1=1, r'_2=1, r'_3=1, \ldots, r'_{24}=1$, and they are storage position candidates produced for the first time.

Figure 7:
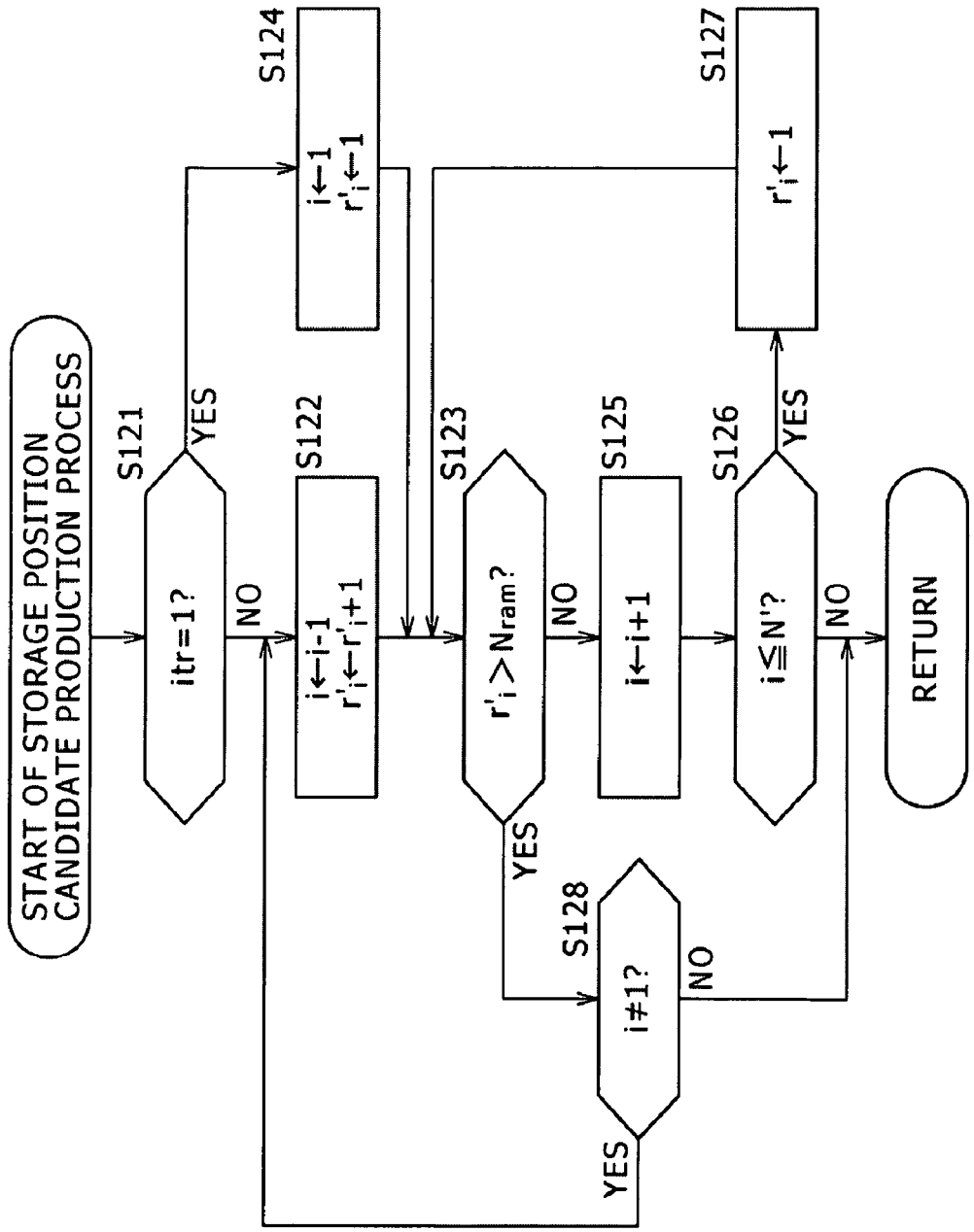
FIG. 7 is a flowchart illustrating an example of a storage position candidate production process.

It is to be noted that, where the storage position candidates are produced, since N logarithmic likelihood ratios $\lambda_n$ or N logarithmic posteriori probability ratios $q_n$ are all stored into the RAM 100, the storage positions in this instance are inappropriate as actual storage positions. Thus, the check result is naturally determined NG by the process at step S104.

Where storage position candidates for the second time are produced, since the variable itr is 2 at step S102 of FIG. 6, the processing advances to step S122 depending upon a result of the decision at step S121 of FIG. 7.

At step S122, the storage position determination section 201 decrements the variable i by 1. Consequently, the variable i becomes 24(=25−1). Then, the storage position candidate $r'_i$ is incremented by 1. In the present case, the storage position candidate $r'_{24}$ is set to 2(1+1).

Then, the processing advances to step S123, at which it is decided whether or not the value of the storage position candidate $r'_i$ is higher than the RAM number $N_{ram}$. In the present case, the storage position candidate $r'_{24}$ is $r'_{24}(=2) \leq N_{ram}(=4)$, and the processing advances to step S125.

At step S125, the value of the variable i is incremented by 1, and at step S126, it is decided whether or not the variable i is equal to or lower than the apparent code length N'. In the present case, the variable i is i (=25)>N'(=24), and the processing ends. In the present case, the storage position candidates are $r'_1=1, r'_2=1, r'_3=1, \ldots, r'_{23}=1, r'_{24}=2$.

Similarly, where storage position candidates for the third time are produced, the they are $r'_1=1, r'_2=1, r'_3=1, r'_{23}=1, r'_{24}=3$, and where storage position candidates for the fourth time are produced, they are $r'_1=1, r'_2=1, r'_3=1, \ldots, r'_{13}=1, r'_{24}=4$.

Where storage position candidates for the fifth time are produced, the processing advances to step S122 as a result of decision at step S121 of FIG. 7, and the storage position determination section 201 decrements the variable i by 1 at step S121. Consequently, the variable i becomes 24(=25−1). Further, the storage position determination section 201 increments the storage position candidate $r'_i$ by one. In the present case, storage position candidate $r'_{24}$ is set to 5(=4+1).

Then, the processing advances to step S123. In this instance, the storage position candidate $r'_{24}$ is $r'_{24}(=5) > N_{ram}(=4)$. Thus, the processing advances to step S128 as a result of the decision at step S123.

At step S128, the storage position determination section 201 decides whether or not the value of the variable i is 1. In this instance, since the variable i is i=24, the processing advances to step S122.

At step S122, the storage position determination section 201 decrements the variable i by 1. Consequently, the variable i becomes i=23(=24−1). Then, the storage position candidate $r'_i$ is incremented by 1. Consequently, the storage position candidate $r'_{23}$ becomes 2(=1+1).

Thereafter, the processing advances to step S123, at which it is decided whether or not the value of the storage position candidate $r'_i$ is higher than the RAM number $N_{ram}$. In the present case, the storage position candidate $r'_{23}$ is $r'_{23}(=2) \leq N_{ram}(=4)$. Thus, the processing advances to step S125.

Then, the processing advances to step S127 through the processes at steps S125 and S126. At step S127, the storage position candidate $r'_{24}$ is set to 1. Then, the processing returns to step S123.

Further, the processing comes to an end through the processes at steps S123 and S125 to S126. In the present case, the storage position candidates $r'_i$ are $r'_1=1, r'_2=1, r'_3=1, \ldots, r'_{23}=2, r'_{24}=1$.

Similarly, when storage position candidates for the sixth time are produced, the storage position candidates are set to $r'_1=1, r'_2=1, r'_3=1, \ldots, r'_{23}=2, r'_{24}=2$, but when storage position candidates for the seventh time are produced, the storage position candidates are set to $r'_1=1, r'_2=1, r'_3=1, r'_{23}=2, r'_{24}=3$.

By repetitively producing storage position candidates in this manner, $N_{ram}^{N'}=4^{24}$ (4 to the power of twenty-four) different storage position candidates r' in the maximum are produced. In particular, where the storage position candidates for the $4^{24}$th time are produced, the storage position candidates of $r'_1=4, r'_2=4, r'_3=4, \ldots, r'_{23}=4, r'_{24}=4$ are produced. It is to be noted that, after storage position candidates for the $4^{24}$th time are produced, the processing advances to step S107 through the processes at steps S104 and S105 of FIG. 6. Since it is decided by the process at step S107 of FIG. 6 that the variable itr is equal to the total number $n_{MAX}(=4^{24})$ of candidates, the storage position determination process is ended.

Now, a detailed example of the storage position candidate check process at step S104 of FIG. 6 is described with reference to a flowchart of FIG. 8.

At step S161, the storage position determination section 201 counts the number of logarithmic likelihood ratios $\lambda_n$ or logarithmic posteriori probability ratios $q_n$ which correspond to (m, n) which satisfy $h_{mn}=1$ and which are stored in each of the RAMs 100 to 103 in each row of the check matrix H where logarithmic likelihood ratios $\lambda_n$ or logarithmic posteriori probability ratios $q_n$ are stored into the RAMs 100 to 103 based on the storage position candidates $r'=[r'_1 r'_2 \ldots r'_i \ldots r'_{N'}]$ produced by the process at step S102 and retains the result of count as counter values.

For example, four counter values are retained corresponding individually to the four RAMs like the counter value of the number of logarithmic likelihood ratios $\lambda_n$ or logarithmic posteriori probability ratios $q_n$ stored in the RAM 100, the counter value of the number of logarithmic likelihood ratios $\lambda_n$ or logarithmic posteriori probability ratios $q_n$ stored in the RAM 101, . . . . Further, since a counter value is acquired for each row (for 12 rows) of the check matrix H, in the present case, totaling 48 (=12×4) counter values are retained.

For example, a counter $cnt_{m,k}$ which is a variable for storing a counter value is defined in advance. Here, the variables m and k are set as $1 \leq m \leq M'$, $1 \leq k \leq N_{ram}$ where M' is defined as given by the expression (23).

$$M' \equiv \begin{cases} M/P \\ M \end{cases} \quad (23)$$

In expression (23), upper: where H is represented by a combination of P×P matrices ditto, lower: in any other case The counter $cnt_{m,k}$ retains the counter value of the number of logarithmic likelihood ratios $\lambda_n$ or logarithmic posteriori probability ratios $q_n$ stored in each of the four RAMs.

For example, where the storage position candidates $r'=[r'_1, r'_2 \ldots r'_i \ldots r'_{N'}]$ produced by the process at step S103 are [1 1 1 1 1 2 2 2 2 2 3 3 3 3 3 3 4 4 4 4 4 4], if the check matrix H is represented by the expression (16), then $h_{mn}=1$ is satisfied in the first row of the check matrix H where (m, n)=(1, 1), (1, 2), (1, 4), (1, 6), (1, 10), (1, 13), (1, 14). Further, since $r'_1=1$, $r'_2=1$, $r'_4=1$, $r'_6=1$, $r'_{10}=2$, $r'_{13}=3$ and $r'_{14}=3$, the logarithmic posteriori probability ratios $q_n$ to be extracted from the first row of the check matrix H, that is, $q_1$, $q_2$, $q_4$, $q_6$, $q_{10}$, $q_{13}$ and $q_{14}$, are stored such that four logarithmic posteriori probability ratios $q_n$ are stored in the RAM of the number "1", that is, the RAM 100, one logarithmic posteriori probability ratio $q_n$ is stored in the RAM of the number "2", that is, the RAM 101, two logarithmic posteriori probability ratios $q_n$ are stored in the RAM of the number "3", that is, the RAM 102, and zero logarithmic posteriori probability ratio $q_n$ is stored in the RAM of the number "4", that is, the RAM 103. Consequently, $cnt_{1,1}=4$, $cnt_{1,2}=1$, $cnt_{1,3}=2$, and $cnt_{1,4}=0$.

At step S162, the storage position determination section 201 decides whether or not one of the 48 different counter values obtained by the process at step S161 is higher than the clock number $N_{rd}$. In the present case, since clock number $N_{rd}$ is 2, if three or more logarithmic likelihood ratios $\lambda_n$ or logarithmic posteriori probability ratios $q_n$ which correspond to (m, n) which satisfy $h_{mn}=1$ in each row are stored in any one of the RAMs 100 to 103, then it is decided at step S162 that one of the counter values is higher than the clock number $N_d$. Thus, the processing advances to step S164.

In this instance, since the logarithmic likelihood ratios $\lambda_n$ or logarithmic posteriori probability ratios $q_n$ which correspond to (m, n) which satisfy $h_{mn}=1$ cannot be read out by less than $N_{rd}$ clocks, a flag representative of the check result of NG or the like is set. It is to be noted that, in the example described above, since the counter $cnt_{1,1}$ is $cnt_{1,1}(=4) > N_{rd}(=2)$, the storage position candidates are inappropriate, and the check result is NG.

On the other hand, if the storage position determination section 201 decides at step S162 that none of the 48 counter values obtained by the process at step S161 exceeds the clock number $N_{rd}$, then the processing advances to step S163.

In this instance, for example, the logarithmic likelihood ratios $\lambda_n$ or logarithmic posteriori probability ratios $q_n$ which correspond to (m, n) which satisfy $h_{mn}=1$ can be read out by a clock number smaller than the clock number $N^{rd}$ as seen in FIG. 3. Therefore, a flag representative of the check result of OK or the like is set.

In this manner, it is checked whether or not the produced storage position candidates are appropriate. In particular, it is checked whether or not those logarithmic likelihood ratios $\lambda_n$ or logarithmic posteriori probability ratios $q_n$ which are to be read out in an arbitrary one row of the check matrix H can all be read out by two-time reading operations.

Figure 8:
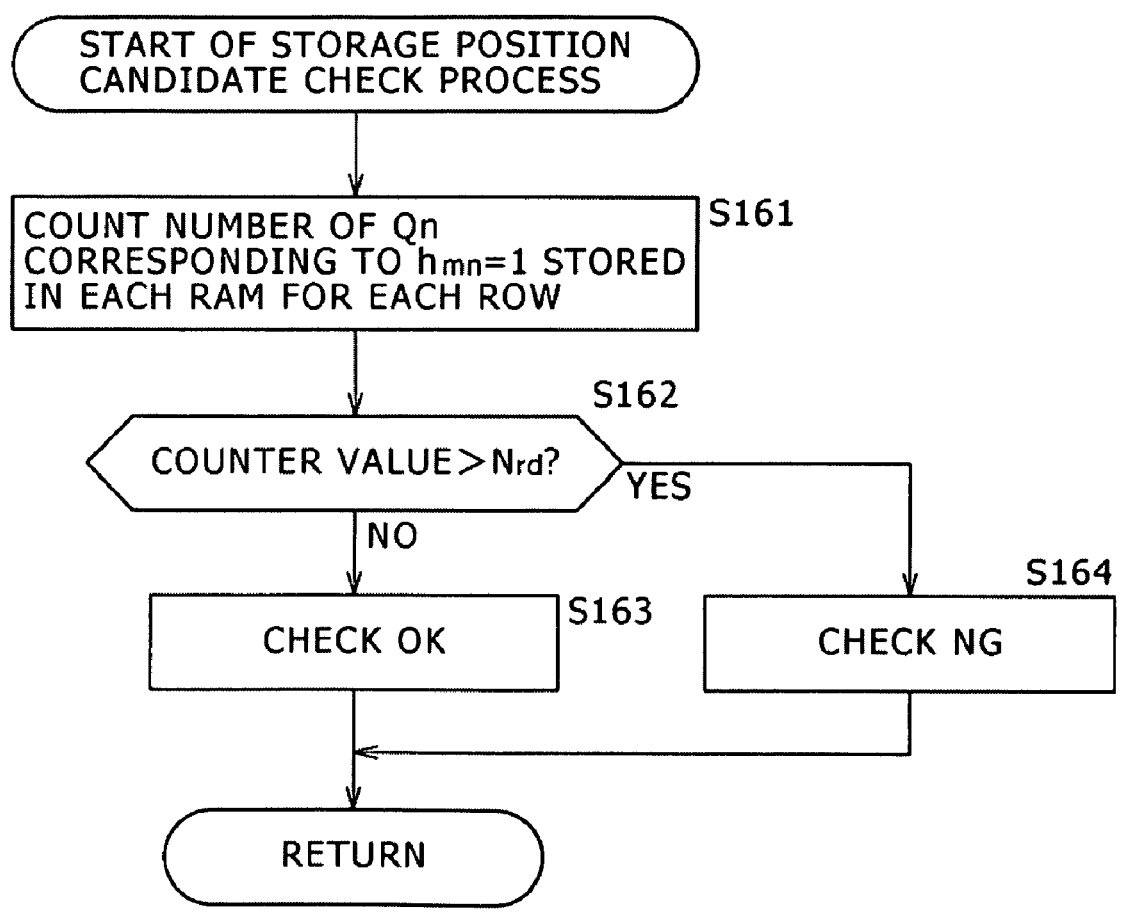
FIG. 8 is a flowchart illustrating an example of a storage position candidate check process.

It is to be noted that, while the process described hereinabove with reference to FIGS. 6 to 8 is an example of a process for appropriately setting the storage positions of the logarithmic likelihood ratios $\lambda_n$ or logarithmic posteriori probability ratios $q_n$ into the RAMs 100 to 103, some other method may be used to appropriately set storage positions.

For example, as the storage position candidates r', only those candidates which allow a uniform number of logarithmic likelihood ratios $\lambda_n$ or logarithmic posteriori probability ratios $q_n$ to be stored into the RAMs may be produced. In particular, when the apparent code length N' determined in accordance with the expression (19) can be divided by the RAM number $N_{ram}$, storage position candidates are produced such that $N_{addr}=N'/N_{ram}$ may be satisfied, but if the apparent code length N' cannot be divided by the RAM number $N_{ram}$, then storage position candidates are produced such that $N_{addr}=\text{ceil}(N'/N_{ram})$ or $N_{addr}=\text{floor}(N'/N_{ram})$ is satisfied. In the present case, storage position candidates are produced such that 24 logarithmic likelihood ratios $\lambda_n$ or logarithmic posteriori probability ratios $q_n$ for one codeword are stored six by six into the four RAMs. Further, in this instance, each of the RAMs 100 to 103 has a number of addresses which corresponds to a value obtained by dividing the code length of LDPC codes or the number of columns of a weight matrix of the check matrix by the number of RAMs, or a value obtained by adding 1 to the thus obtained value or else a value obtained by subtracting 1 from the obtained value.

While it is described that, in the process described hereinabove with reference to FIG. 7, the total number of candidates to be produced can be represented by $N_{ram}^{N'}$, where storage position candidates are produced in accordance with this method, the total number $n_{MAX}$ of storage position candidates to be produced can be represented by the expression (24). It is to be noted that the symbol "!" represents a factorial, and $_xC_y$ represents the total number of combinations where different y choices are selected from among x choices. By this, the number of candidates to be produced by the storage position candidate production process can be reduced and a search of a higher efficiency can be achieved.

$$n_{MAX} = \begin{cases} \dfrac{N'!}{\left\{\left(\dfrac{N'}{N_{ram}}\right)!\right\}^{N_{addr}}} \\ N_{ram}C_\gamma \cdot \dfrac{N'!}{\left(\left(\text{ceil}\left(\dfrac{N'}{N_{ram}}\right)\right)!\right)^\gamma \cdot \left(\left(\text{floor}\left(\dfrac{N'}{N_{ram}}\right)\right)!\right)^{N_{addr}}} \end{cases} \quad (24)$$

In the expression (24), upper: when N' can be divided by $N_{ram}$ ditto, lower: in any other case In this manner, storage positions can be set appropriately by a method different from the process described hereinabove with reference to FIGS. 6 to 8. In a word, it is necessary to make it possible to determine such appropriate storage positions as described hereinabove with reference to FIG. 3.

Further as described hereinabove, the storage positions determined by execution of the process described hereinabove, for example, with reference to FIGS. 6 to 8 by the storage position determination section 201 are supplied to the control section 203 and stored into the internal memory, of the controller 112 or the like in advance. In particular, the storage position candidates r' are stored as determined storage positions r into the internal memory of the controller 112 or the like by the process at step S106 of FIG. 6.

Figure 9:
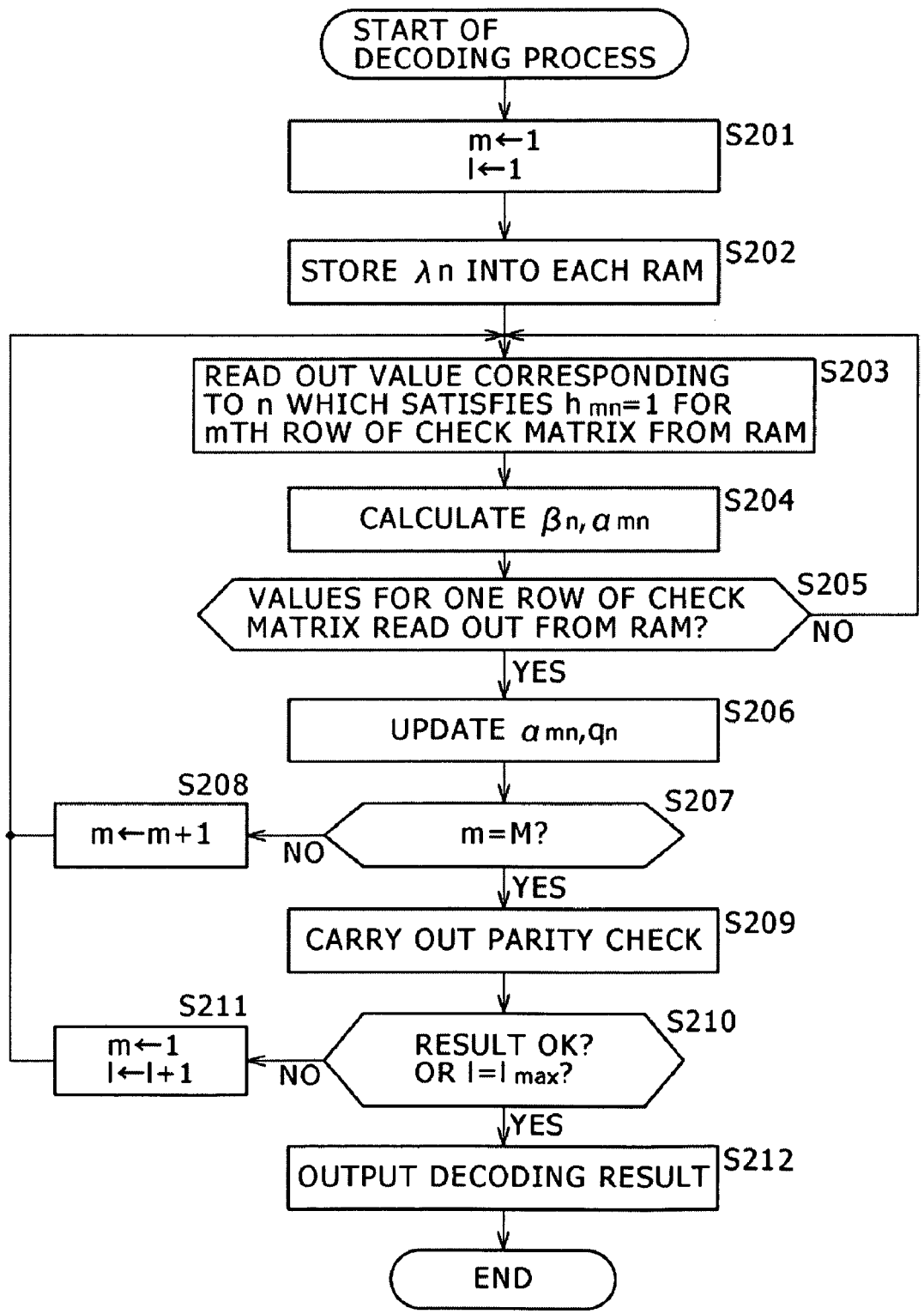
FIG. 9 is a flowchart illustrating an example of a decoding process.

Now, a decoding process by the decoding apparatus 10 is described with reference to a flowchart of FIG. 9. This process is executed, for example, when a codeword to be decoded is received.

At step S201, variables m and l are initialized to 1.

At step S202, the decoding section 202 stores logarithmic likelihood ratios $\lambda_n$ into the RAMs 100 to 103.

At this time, for example, logarithmic likelihood ratios $\lambda_n$ corresponding to each bit of the codeword are supplied to the switches 108 to 111, and control signals c11 to c14 for controlling the switches 108 to 111 are outputted based on the storage positions stored in the internal memory of the controller 112 or the like. Consequently, 24 logarithmic likelihood ratios $\lambda_n$ are successively stored into appropriate addresses of the RAMs 100 to 103.

It is to be noted that, by a later process, the 24 logarithmic likelihood ratios $\lambda_n$ stored in the addresses of the RAMs 100 to 103 are updated as 24 logarithmic posteriori probability ratios $q_n$.

At step S203, the decoding section 202 reads out logarithmic likelihood ratios $\lambda_n$ which correspond to (m, n) which satisfy $h_{mn}=1$ in the mth row of the check matrix H from the RAMs 100 to 103.

At this time, control signals c21 to c24 are outputted based on the storage positions stored in the internal memory of the controller 112 or the like and the information of the check matrix H, and those logarithmic likelihood ratios $\lambda_n$ which correspond to (m, n) which satisfy $h_{mn}=1$ in the first row of the check matrix H are read out from the RAMs 100 to 103 as logarithmic posteriori probability ratios $q_n$ before updated and are supplied to the variable node processing section 113. Further, those message $\alpha_{mn}$ necessary for mathematical operation are read out as signals a1 to a4 from the RAMs 104 to 107 based on the control signals c31 to c34 and are supplied to the variable node processing section 113.

At step S204, the decoding section 202 calculates the values of $\alpha_{mn}$ and $\beta_n$.

At this time, the variable node processing section 113 carries out mathematical operation represented by the expression (13) and supplies the thus calculated $\beta_n$ to the check node processing section 114. Further, the check node processing section 114 carries out mathematical operation represented by the expression (14).

At step S205, the decoding section 202 decides whether or not all of the logarithmic likelihood ratios $\lambda_n$ or logarithmic posteriori probability ratios $q_n$ which correspond to (m, n) which satisfy, $h_{mn}=1$ for one row of the check matrix H are read out from the RAMs 100 to 103. If it is decided that all of the logarithmic likelihood ratios own or logarithmic posteriori probability ratios $q_n$ are not read out as yet, then the processing returns to step S203 to repetitively execute the processes at steps S203 to S205.

It is to be noted that, since the processes described hereinabove with reference to FIGS. 6 to 8 are executed to determine storage positions, all of the logarithmic likelihood ratios $\lambda_n$ or logarithmic posteriori probability ratios $q_n$ which correspond to (m, n) which satisfy $h_{mn}=1$ for one row of the check matrix H are read out by reading from the RAMs 100 to 103 by one more time.

If it is decided at step S205 that all of the logarithmic likelihood ratios $\lambda_n$ or logarithmic posteriori probability ratios $q_n$ are read out already, that is, after the steps S203 to S205 are executed twice, the processing advances to step S206.

At step S206, the decoding section 202 controls the check node processing section 114 to mathematically operate updated message $\alpha_{mn}$ using the $\beta_n$ values for one row of the check matrix H determined in accordance with the expression (13) and supplies the updated message $\alpha_{mn}$ as signals a1' to a4' to the arithmetic unit 115 and RAMs 104 to 107. Further, the arithmetic unit 115 executes mathematical operation represented by the expression (15) to calculate logarithmic posteriori probability ratios $q_n$ to update the values stored in the RAMs 100 to 103.

At step S207, it is decided whether or not updating of the logarithmic posteriori probability ratios $q_n$ is carried out for the M columns of the check matrix H, that is, for the entire check matrix H. In the present case, M is 12. If it is decided at step S207 that the variable m is not equal to the column number M, then since the calculation for all of the rows is not completed as yet, the processing advances to step S208, at which the variable m is incremented by 1. Thereafter, the processing returns to step S203. On the other hand, if it is decided at step S207 that the variable in is equal to the column number M, since the calculation for all rows is completed already, the processing advances to step S209.

At step S209, the decoding section 202 carries out parity check. At this time, the parity check section 116 executes the processes at steps B3 to B4 of the Layered BP decoding method described hereinabove to produce a signal p representative of a result (OK or NG) of the parity check, and supplies the signal p to the controller 112.

At step S210, the decoding section 202 decides whether or not the result of the parity check at step S209 is OK or whether or not the variable l representative of the number of times of repetition reaches an upper limit $l_{max}$ to the number of times of repetition. If it is decided that the result of the parity check is not OK, that is, the result of the parity check is NG, then the processing advances to step S211.

At step S211, the decoding section 202 initializes the value of the variable m to 1 and increments the value of the variable l by 1. Thereafter, the processing returns to step S203 so that the processes at the steps beginning with step S203 are repetitively executed.

On the other hand, if it is decided at step S210 that the result is OK or the variable l representative of the upper limit number of times reaches the upper limit $l_{max}$ to the number of times of repetition, then the processing advances to step S212, at which the decoding section 202 outputs a result of the decoding.

At this time, the control signal c4 is outputted so that the logarithmic posteriori probability ratios $q_n$ for one codeword are outputted from the switch 117 to the sign decision section 118. Then, the sign decision section 118 decides the signal supplied thereto between the signs of the positive and the negative, and maps, for example, "0" and "1" for the positive and the negative of the data, respectively. Then, the sign decision section 118 outputs resulting data for one codeword (24 bits) of the result of decoding.

Decoding of LDPC codes is carried out in such a manner as described above.

In this manner, with the embodiment described above, logarithmic likelihood ratios $\lambda_n$ or logarithmic posteriori probability ratios $q_n$ are stored into a plurality of RAMs, that is, $N_{ram}$ RAMs, and a plurality of logarithmic likelihood ratios $\lambda_n$ or logarithmic posteriori probability ratios $q_n$ which satisfy $h_{mn}=1$ in each row of a check matrix are read out simultaneously. Therefore, when compared with an alternative configuration wherein logarithmic likelihood ratios $\lambda_n$ or logarithmic posteriori probability ratios $q_n$ are stored into a single RAM and are read out one by one through address designation, the number of clocks necessary for decoding can be suppressed to one $N_{ram}$th.

Further, with the embodiment described above, calculation for one row of a check matrix, that is, mathematical operation of the values of messages $\alpha_{mn}$, $\beta_n$ and logarithmic posteriori probability ratios $q_n$, is carried out divisionally by $N_{rd}$ times. Therefore, in comparison with an alternative configuration wherein logarithmic likelihood ratios $\lambda_n$ or logarithmic posteriori probability ratios $q_n$ for one row of a check matrix are all read out at a time and calculation for one row is carried out in parallel, the circuit scale can be reduced to $1/N_{rd}$ and sharing of a calculation circuit can be anticipated as well.

Further, in the alternative configuration wherein logarithmic likelihood ratios $\lambda_n$ or logarithmic posteriori probability ratios $q_n$ for one row of a check matrix are all read out at a time, a selector for sequentially selecting a desired logarithmic likelihood ratio $\lambda_n$ or logarithmic posteriori probability ratio $q_n$ from among logarithmic likelihood ratios $\lambda_n$ or logarithmic posteriori probability ratios $q_n$ stored in a register or the like is required. In contrast, with the embodiment described above, such a selector as described above is not required, and therefore, reduction of the circuit scale can be anticipated.

Also it is possible to apply an embodiment to a decoding apparatus for LDPC codes which uses a check matrix formed from small matrices having, for example, such a cyclic structure as represented by the expression (21). As described hereinabove, the expression (21) includes 32 small matrices each formed as a 4×4 matrix including four rows and four columns.

Figure 10:
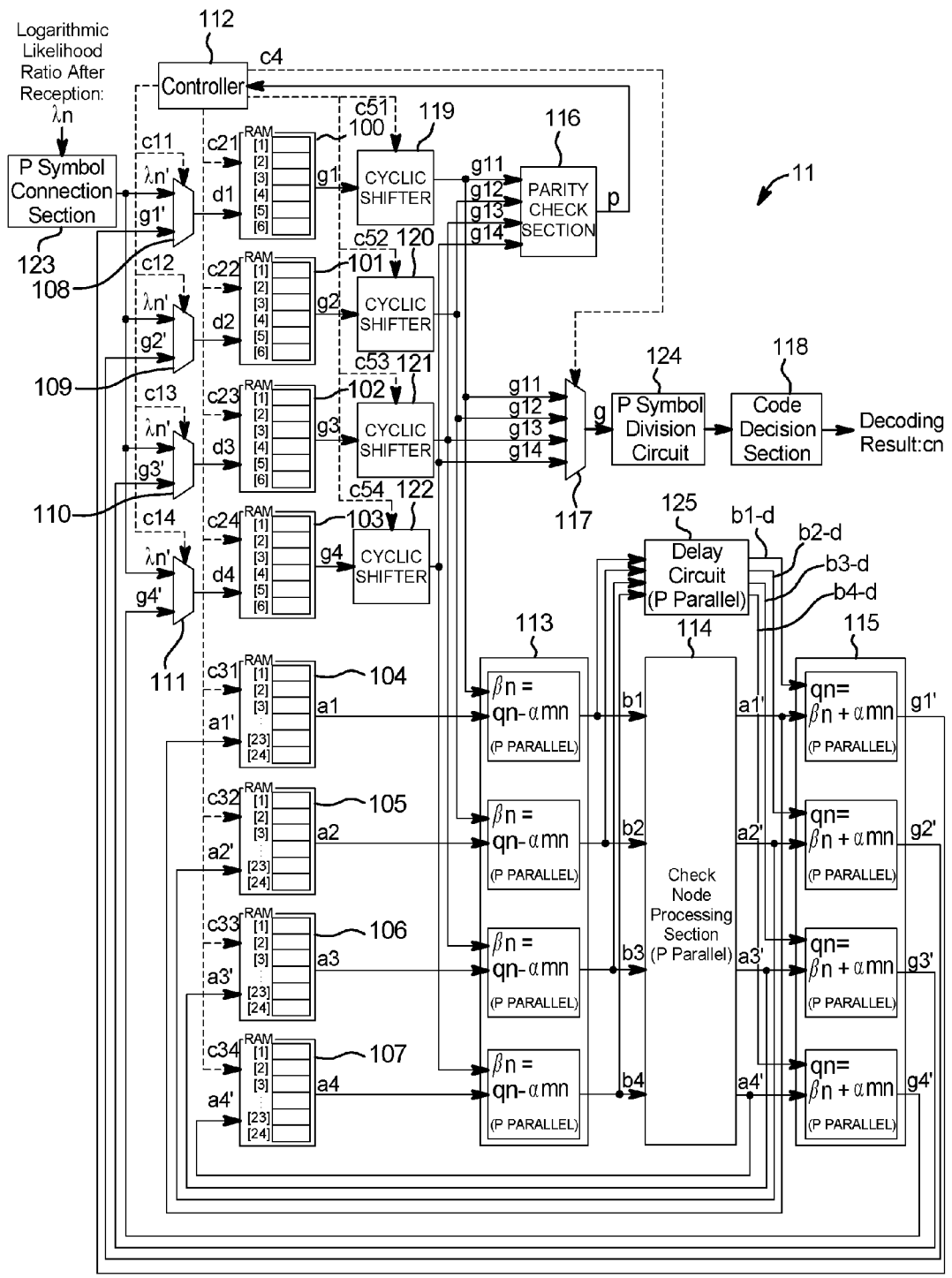
FIG. 10 is a block diagram showing another example of a configuration of a decoding apparatus to which another embodiment is applied.

FIG. 10 is a block diagram showing an example of another configuration of a decoding apparatus to which an embodiment is applied. The decoding apparatus 11 shown in FIG. 10 carries out decoding of LDPC codes using the check matrix H represented by the expression (21).

In the decoding apparatus 11 shown in FIG. 10, different from the decoding apparatus 10 shown in FIG. 4, not one but P (in the present case, four) data are written into one address of each of the RAMs 100 to 107. Therefore, the decoding apparatus 11 includes a symbol connection circuit 123 for accumulating P logarithmic likelihood ratios $\lambda_n$ to be written first and combining the P logarithmic likelihood ratios $\lambda_n$ into one data.

For example, where one logarithmic likelihood ratio $\lambda_n$ or logarithmic posteriori probability ratio $q_n$ is represented as data of one octet, data of four octets are written into one address of each of the RAMs 100 to 107.

Further, the decoding apparatus 11 shown in FIG. 10 includes a symbol division circuit 124 which converts, before a result of decoding is outputted, combined one data back into original P (in the present case, four) data.

Accordingly, signals d1 to d4 representative of data to be supplied to the RAMs 100 to 103, signals g1 to g4 representative of data read out from the RAMs 100 to 103 and signals a1 to a4 representative of data read out from the RAMs 104 to 107 in FIG. 10 correspond each to data, for example, for four octets.

Further, the decoding apparatus 11 shown in FIG. 10 includes cyclic shifters 119 to 122 for shifting the bit positions of four data outputted from the RAMs 100 to 103, respectively. The cyclic shifters 119 to 122 shift octets which form, for example, data of four octets corresponding to four logarithmic likelihood ratios $\lambda_n$ or four logarithmic posteriori probability ratios $q_n$.

While the 32 small matrices of the expression (21) are each formed as a matrix of four rows and four columns, in each of the small matrices, only one element has the value 1, that is, a non-zero value in each row. Accordingly, when four logarithmic likelihood ratios $\lambda_n$ or four logarithmic posteriori probability ratios $q_n$ are supplied to the variable node processing section 113, it is necessary to specify that one of the logarithmic likelihood ratios $\lambda_n$ or logarithmic posteriori probability ratios $q_n$ which corresponds to the element of the non-zero value of the check matrix H from among the four logarithmic likelihood ratios $\lambda_n$ or four logarithmic posteriori probability ratios $q_n$, that is, that of the logarithmic likelihood ratios $\lambda_n$ or logarithmic posteriori probability ratios $q_n$ which satisfies $h_{mn}=1$.

The cyclic shifters 119 to 122 shift data of an octet corresponding to the logarithmic likelihood ratio $\lambda_n$ or logarithmic posteriori probability ratio $q_n$ which satisfies $h_{mn}=1$ from among data of four octets corresponding to four logarithmic likelihood ratios $\lambda_n$ or four logarithmic posteriori probability ratios $q_n$, for example, to the first octet. It is to be noted that the cyclic shifters 119 to 122 are controlled by control signals c51 to c54 outputted from the controller 112 to shift data in such a manner as described above.

Accordingly, signals g11 to g14 representative of data outputted from the cyclic shifters 119 to 122 in FIG. 10 correspond to data for four octets obtained by shifting the octet positions of the data of the signals g1 to g4, respectively.

Further, while the variable node processing section 113 to the arithmetic unit 115 and the delay circuit 125 shown in FIG. 10 carry out similar processes to those in FIG. 4, they are each formed from four mathematical operation circuits connected in parallel so that processing is carried out parallelly for four data.

Accordingly, signals b1 to b4 representative of data outputted from the variable node processing section 113, signals a1' to a4' representative of data outputted from the check node processing section 114 and signals g1' to g4' representative of data outputted from the arithmetic unit 115 individually correspond to data, for example, for four octets.

The other part of the decoding apparatus 11 shown in FIG. 10 is similar to that of the decoding apparatus 10 shown in FIG. 4.

In this manner, it is possible to apply the embodiment to configure a decoding apparatus for LDPC codes which uses a check matrix composed of small matrices having a cyclic structure.

Furthermore, according to the embodiment, it is possible to carry out, if the code length is less than the code length N (in the present case, 24), decoding of LDPC codes which uses different coding rates, different code lengths or different check matrices.

For example, where a coding rate, a code length or a check matrix different from that in the example described hereinabove is used, the process described hereinabove with reference to FIGS. 6 to 8 is carried out again and new storage positions are determined by the storage position determination section 201.

Then, the controller 112 outputs control signals c11 to c14, control signals c21 to c24 and control signals c31 to c34 corresponding to the new storage positions and the check matrix.

It is to be noted, however, that it is necessary for the value of $N_{rd} \times M'$ determined newly to be lower than the original value of $N_{rd} \times M'$.

As an example, a case wherein a check matrix H represented by the expression (25) given below is used, for example, in place of the check matrix H represented by the expression (16) is studied. The check matrix H of the expression (25) is used for LDPC codes whose coding rate is ⅔, and the maximum value $w_{RMax}$ of the row weight is $w_{RMax}=11$. In the present case, since $N_{ram}=4$, $N_{rd}=3(=\text{ceil}(w_{RMax}/N_{ram})=\text{ceil}(11/4))$ from the expression (18).

$$H = \begin{bmatrix} 1 & 1 & 0 & 0 & 1 & 1 & 0 & 0 & 0 & 1 & 0 & 1 & 1 & 0 & 0 & 1 & 1 & 1 & 0 & 0 & 0 & 0 & 0 & 0 \\ 1 & 0 & 1 & 1 & 1 & 0 & 0 & 1 & 1 & 0 & 0 & 1 & 1 & 0 & 0 & 0 & 0 & 1 & 1 & 0 & 0 & 0 & 0 & 0 \\ 1 & 1 & 0 & 0 & 1 & 0 & 1 & 0 & 1 & 0 & 1 & 1 & 1 & 0 & 0 & 0 & 0 & 0 & 1 & 1 & 0 & 0 & 0 & 0 \\ 1 & 0 & 1 & 0 & 0 & 0 & 1 & 0 & 1 & 1 & 0 & 0 & 1 & 1 & 1 & 0 & 1 & 0 & 0 & 1 & 1 & 0 & 0 & 0 \\ 0 & 0 & 0 & 1 & 1 & 0 & 1 & 1 & 1 & 0 & 0 & 0 & 1 & 0 & 1 & 1 & 0 & 0 & 0 & 0 & 1 & 1 & 0 & 0 \\ 1 & 0 & 0 & 1 & 1 & 1 & 0 & 0 & 1 & 0 & 1 & 0 & 1 & 1 & 0 & 0 & 0 & 0 & 0 & 0 & 0 & 1 & 1 & 0 \\ 1 & 1 & 0 & 0 & 1 & 0 & 0 & 1 & 1 & 1 & 0 & 0 & 0 & 1 & 0 & 1 & 0 & 0 & 0 & 0 & 0 & 0 & 1 & 1 \\ 1 & 0 & 1 & 0 & 1 & 1 & 0 & 0 & 1 & 0 & 1 & 0 & 1 & 0 & 1 & 0 & 1 & 0 & 0 & 0 & 0 & 0 & 0 & 1 \end{bmatrix} \quad (25)$$

In this instance, where storage positions are determined by the process described hereinabove with reference to FIGS. 6 to 8, for example, r'=[1 1 1 1 2 3 2 3 3 4 2 4 4 2 2 1 3 2 3 3 1 4 4 4] is obtained as the determined storage position candidates r'=[$r'_1$ $r'_2$ ... $r'_i$ ... $r'_{N'}$]. By storing logarithmic posteriori probability ratios $q_n$ or the like into the thus obtained storage positions, LDPC codes which use the check matrix H represented by the expression (25) can be decided by the decoding apparatus 10 or 11 of the configuration described hereinabove with reference to FIG. 4 or 10 without changing the circuit confirmation from that where the check matrix H is represented by the expression (16).

It is to be noted that, while the examples described above use the Layered BP decoding method, the embodiment can be applied also to a decoding apparatus which uses the sum-product decoding method.

It is to be noted that, while the series of processes described above can be executed by hardware, it may otherwise be executed by software. Where the series of processes is executed by software, a program which constructs the software is installed from a network or a program recording medium into a computer incorporated in hardware for exclusive use or, for example, such a personal computer 500 for universal use as shown in FIG. 11 which can execute various functions by installing various programs.

Figure 11:
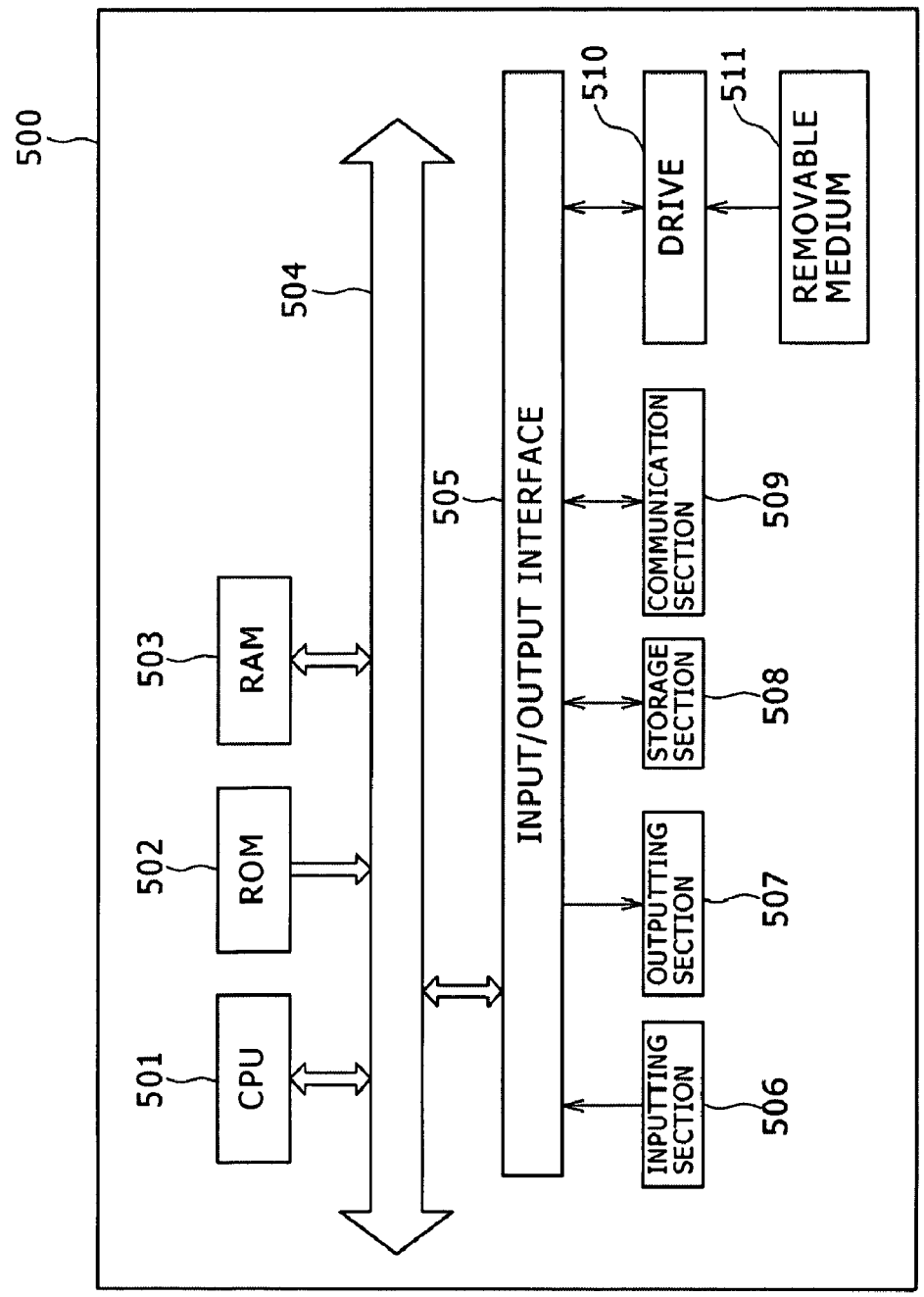
FIG. 11 is a block diagram showing an example of a configuration of a personal computer.

Referring to FIG. 11, a central processing unit (CPU) 501 executes various processes in accordance with a program stored in a ROM (Read Only Memory) 502 or a program loaded from a storage section 508 into a RAM (Random Access Memory) 503. Also data necessary for the CPU 501 to execute the processes are suitably stored into the RAM 503.

The CPU 501, ROM 502 and RAM 503 are connected to one another by a bus 504. Also an input/output interface 505 is connected to the bus 504.

An inputting section 506 including a keyboard, a mouse and so forth, an outputting section 507 including a display unit which may be a CRT (Cathode Ray Tube) or an LCD (Liquid Crystal Display) unit, a speaker and so forth, a storage section 508 formed from a hard disk or the like, a communication section 509 including a modem, a network interface card such as a LAN (Local Area Network) card and so forth are connected to the input/output interface 505. The communication section 509 performs a communication process through a network such as the Internet.

Further, as occasion demands, a drive 510 is connected to the input/output interface 505. A removable medium 511 such as a magnetic disk, an optical disk, a magneto-optical disk, a semiconductor memory or the like is suitably loaded into the drive 510, and a computer program read from the loaded medium is installed into the storage section 508 as occasion demands.

Where the series of processes described above is executed by software, a program which constructs the software is installed from a network such as the Internet or a recording medium which may be formed from the removable medium 511.

It is to be noted that the program recording medium may be formed from a removable medium 511 shown in FIG. 11 formed from a magnetic disk (including a floppy disk (registered trademark)), an optical disk (including a CD-ROM (Compact Disk-Read Only Memory) and a DVD (Digital Versatile Disk)), a magneto-optical disk (including an MD (Mini-Disk) (trademark)), or a semiconductor memory which has the program recorded thereon or therein and is distributed to provide the program to a user separately from an apparatus body. Else, the program recording medium may be formed as the ROM 502, a hard disk included in the storage section 508 or the like in which the program is recorded and which is distributed in a form wherein it is incorporated in advance in an apparatus body.

It is to be noted that the steps for executing the series of processes described in the present specification may be but need not necessarily be processed in a time series in the order as described, and include processes which are executed in parallel or individually without being processed in a time series.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A decoding apparatus for decoding low density parity check codes, comprising:
   a plurality of storage means for storing logarithmic likelihood ratios or logarithmic posteriori probability ratios for one codeword into addresses thereof which are independent of each other; and
   readout means for simultaneously reading out, from among the logarithmic likelihood ratios or logarithmic posteriori probability ratios for the one codeword stored in said storage means, a plurality of ones of the logarithmic likelihood ratios or logarithmic posteriori probability ratios which correspond to non-zero value elements in a predetermined one row of the check matrix used in a coding process of the low density parity check codes; and
   wherein the readout time number necessary to read out all of those of the logarithmic likelihood ratios or logarithmic posteriori probability ratios which correspond to the non-zero values in an arbitrary row of the check matrix from said storage means is a number obtained by rounding a value obtained by dividing the maximum value of the row weight of the check matrix by the number of said storage means upwards into a digital value.

2. The decoding apparatus according to claim 1, wherein the number of said storage means is smaller than a maximum value of a row weight of the check matrix.

3. The decoding apparatus according to claim 1, further comprising storage position determination means for storing the logarithmic likelihood ratios or logarithmic posteriori probability ratios for the one codeword into said storage means such that all of those of the logarithmic likelihood ratios or logarithmic posteriori probability ratios which correspond to the non-zero value elements in an arbitrary row of the check matrix can be read out from said storage means by a number of times of reading out obtained by dividing the maximum value of the row weight of the check matrix by the number of said storage means upwards into a digital value.

4. The decoding apparatus according to claim 3, wherein each of said storage means has a number of addresses which corresponds to a value obtained by dividing the code length of the low density parity check codes or the number of columns of a weight matrix of the check matrix by the number of said storage means, or a value obtained by adding one to the thus obtained value or else a value obtained by subtracting one from the obtained value, and the logarithmic likelihood ratios or logarithmic posteriori probability ratios for the one codeword are individually stored into said storage means.

5. The decoding apparatus according to claim 4, wherein said storage position determination means produces storage position determination information for specifying one of said storage means and the address in which each of the logarithmic likelihood ratios or logarithmic posteriori probability ratios for the one codeword is stored, and said readout means simultaneously reads out a plurality of ones of the logarithmic likelihood ratios or logarithmic posteriori probability ratios based on the storage position determination information.

6. The decoding apparatus according to claim 1, wherein, where the check matrix includes a plurality of small matrices having P rows and P columns, P ones of the logarithmic likelihood ratios or logarithmic posteriori probability ratios which correspond to P elements of each small pixel are stored into one address of one of said storage means.

* * * * *